US012249671B2

(12) United States Patent
Choi et al.

(10) Patent No.: US 12,249,671 B2
(45) Date of Patent: Mar. 11, 2025

(54) NANOROD LIGHT EMITTING DEVICE, SUBSTRATE STRUCTURE INCLUDING A PLURALITY OF NANOROD LIGHT EMITTING DEVICES, AND METHOD OF MANUFACTURING THE SUBSTRATE STRUCTURE

(71) Applicant: SAMSUNG ELECTRONICS CO., LTD., Suwon-si (KR)

(72) Inventors: Junhee Choi, Seongnam-si (KR); Nakhyun Kim, Yongin-si (KR); Joosung Kim, Seongnam-si (KR); Eunsung Lee, Seoul (KR); Joohun Han, Hwaseong-si (KR); Kiho Kong, Suwon-si (KR); Junghun Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 478 days.

(21) Appl. No.: 17/582,172

(22) Filed: Jan. 24, 2022

(65) Prior Publication Data

US 2022/0406959 A1 Dec. 22, 2022

(30) Foreign Application Priority Data

Jun. 22, 2021 (KR) .................. 10-2021-0081031

(51) Int. Cl.
*H01L 33/00* (2010.01)
*H01L 33/06* (2010.01)
(Continued)

(52) U.S. Cl.
CPC ........ *H01L 33/0075* (2013.01); *H01L 33/007* (2013.01); *H01L 33/12* (2013.01);
(Continued)

(58) Field of Classification Search
CPC ... H01L 33/0075; H01L 33/007; H01L 33/12; H01L 33/44; H01L 25/0753;
(Continued)

(56) References Cited

U.S. PATENT DOCUMENTS 6,858,081 B2 * 2/2005 Biwa ............... C30B 29/403
117/89
8,179,938 B2 * 5/2012 Kim ............... H01L 33/24
438/47
(Continued)

FOREIGN PATENT DOCUMENTS

CN 107482094 A 12/2017
CN 108878608 A 11/2018
(Continued)

OTHER PUBLICATIONS

Communication dated Jul. 13, 2022 issued by the European Patent Office in counterpart European Application No. 22153654.3.
(Continued)

*Primary Examiner* — Duy T Nguyen
(74) *Attorney, Agent, or Firm* — Sughrue Mion, PLLC

(57) ABSTRACT

Provided is a substrate structure including a substrate, a buffer layer disposed on the substrate, a porous semiconductor layer disposed on the buffer layer, the porous semiconductor layer having a plurality of voids, a plurality of semiconductor light emitting structures disposed on the porous semiconductor layer, the plurality of semiconductor light emitting structures having a nanorod shape extending vertically, and a passivation film disposed on a side wall of each of the plurality of semiconductor light emitting structures, the passivation film having an insulation property.

10 Claims, 34 Drawing Sheets

(51) Int. Cl.
*H01L 33/12* (2010.01)
*H01L 33/20* (2010.01)
*H01L 33/44* (2010.01)
*H01L 25/075* (2006.01)

(52) U.S. Cl.
CPC .......... *H01L 33/44* (2013.01); *H01L 25/0753* (2013.01); *H01L 33/0093* (2020.05); *H01L 33/06* (2013.01); *H01L 33/20* (2013.01); *H01L 2933/0025* (2013.01)

(58) Field of Classification Search
CPC ..... H01L 33/0093; H01L 33/06; H01L 33/20; H01L 2933/0025; H01L 33/0095; H01L 33/08; H01L 33/24; H01L 33/16; H01L 27/156; H01L 33/0012; H01L 33/005; B82Y 10/00; B82Y 20/00; B82Y 40/00
USPC .......................................................... 257/13
See application file for complete search history.

(56) References Cited

U.S. PATENT DOCUMENTS

| | | | |
|---|---|---|---|
| 10,458,038 | B2 | 10/2019 | Zhang et al. |
| 2012/0223289 | A1 | 9/2012 | Gwo et al. |
| 2013/0221369 | A1 | 8/2013 | Bergbauer et al. |
| 2014/0145237 | A1 | 5/2014 | Do et al. |
| 2015/0041822 | A1* | 2/2015 | Hwang ................... H01L 33/10 257/98 |
| 2020/0227255 | A1 | 7/2020 | Zhu et al. |
| 2021/0057601 | A1 | 2/2021 | Oliver et al. |
| 2021/0399173 | A1* | 12/2021 | Choi ....................... H01L 33/18 |
| 2022/0077346 | A1* | 3/2022 | Hwang .................. H01L 33/12 |
| 2022/0085097 | A1* | 3/2022 | Song ....................... H01L 33/12 |
| 2022/0209066 | A1* | 6/2022 | Tan ......................... H01L 33/06 |
| 2022/0416120 | A1 | 12/2022 | Kim et al. |

FOREIGN PATENT DOCUMENTS

| | | | |
|---|---|---|---|
| CN | 109830583 B | | 10/2020 |
| KR | 10-0663745 B1 | | 1/2007 |
| KR | 10-2020-0088934 A | | 7/2020 |
| WO | WO2015020233 | * | 2/2015 |
| WO | 2021/050731 A1 | | 3/2021 |

OTHER PUBLICATIONS

Hwang et al. "Development of InGaN-based red LED grown on (0001) polar surface" Applied Physics Express 7, 071003, Jun. 23, 2014, 5 pages, http://dx.doi.org/10.7567/APEX.7.071003.

Zhang et al., "Mesoporous GaN for Photonic Engineering—Highly Reflective GaN Mirrors as an Example", Jun. 18, 2015, ACS Photonics, ACS Paragon Plus Environment http://pubs.acs.org, 21 pages.

Zhang et al., "A conductivity-based selective etching for next generation GaN devices", Jun. 2, 2010, Physical Status Solidi B 247, No. 7, 4 pages.

* cited by examiner

NANOROD LIGHT EMITTING DEVICE, SUBSTRATE STRUCTURE INCLUDING A PLURALITY OF NANOROD LIGHT EMITTING DEVICES, AND METHOD OF MANUFACTURING THE SUBSTRATE STRUCTURE

CROSS-REFERENCE TO RELATED APPLICATION

This application is based on and claims priority under 35 U.S.C. § 119 to Korean Patent Application No. 10-2021-0081031, filed on Jun. 22, 2021, in the Korean Intellectual Property Office, the disclosure of which is incorporated by reference herein in its entirety.

BACKGROUND

1. Field

Example embodiments of the present disclosure relate to a nanorod light emitting device having a nano-scale diameter and improved luminous efficiency, a substrate structure including a plurality of nanorod light emitting devices, and a method of manufacturing the substrate structure.

2. Description of Related Art

Light emitting diodes (LEDs) are known as the next-generation of light sources due to the advantages such as long lifespan, low power consumption, fast response speed, and environmental friendliness compared to conventional light sources. Because of these advantages, the industrial demand for LEDs is increasing. LEDs are generally applied to various products such as lighting devices and backlights of display devices.

Recently, micro-units or nano-units of micro LEDs using group II-VI or group III-V compound semiconductors have been developed. In addition, micro LED displays in which such micro LEDs are directly applied as light emitting elements of display pixels have been developed. However, when LEDs are miniaturized to a micro unit or a nano unit as described above, the luminous efficiency of the LEDs may be lowered.

SUMMARY

One or more example embodiments provide a nanorod light emitting device having a nano-scale diameter and improved luminous efficiency, a substrate structure including a plurality of nanorod light emitting devices, and a method of manufacturing the substrate structure.

Additional aspects will be set forth in part in the description which follows and, in part, will be apparent from the description, or may be learned by practice of example embodiments of the disclosure.

According to an aspect of an example embodiment, there is provided a substrate structure including a substrate, a buffer layer disposed on the substrate, a porous semiconductor layer disposed on the buffer layer, the porous semiconductor layer having a plurality of voids, a plurality of semiconductor light emitting structures disposed on the porous semiconductor layer, the plurality of semiconductor light emitting structures having a nanorod shape extending vertically, and a passivation film disposed on a side wall of each of the plurality of semiconductor light emitting structures, the passivation film having an insulation property.

Each of the plurality of semiconductor light emitting structures may include a first semiconductor layer disposed on the porous semiconductor layer and doped with an impurity of a first conductivity type, a light emitting layer disposed on the first semiconductor layer and having a multi-quantum well structure, a second semiconductor layer disposed on the light emitting layer and doped with an impurity of a second conductivity type that is electrically opposite to the first conductivity type; and an electrode disposed on the second semiconductor layer.

The porous semiconductor layer may be doped with the impurity of the first conductivity type.

A lower portion of the first semiconductor layer may extend horizontally along an upper surface of the porous semiconductor layer such that lower portions of the first semiconductor layer of the plurality of semiconductor light emitting structures are connected to each other, and the passivation film may extend over an upper surface of the first semiconductor layer between the plurality of semiconductor light emitting structures.

Each of the plurality of semiconductor light emitting structures may further include a superlattice layer disposed between the first semiconductor layer and the light emitting layer, and the superlattice layer may include a plurality of first layers including a same material as a material of the first semiconductor layer, and a plurality of second layers including a same material as a material of the light emitting layer, the plurality of second layer being alternately stacked with the plurality of first layers.

Each of the plurality of semiconductor light emitting structures may have a height ranging from 1 μm to 20 μm, and a diameter ranging from 0.05 μm to 1 μm.

The substrate structure may further include a planarization layer disposed between the porous semiconductor layer and the plurality of semiconductor light emitting structures.

The porous semiconductor layer and the planarization layer may include a same semiconductor material, and the porous semiconductor layer may be doped with an impurity of a first conductivity type, and the planarization layer may not be doped or doped with the impurity of the first conductivity type with a doping concentration lower than a doping concentration of the porous semiconductor layer.

The doping concentration of the porous semiconductor layer may range from $10^{18}$ cm$^{-3}$ to $10^{20}$ cm$^{-3}$, and the doping concentration of the planarization layer may range from 0 cm$^{-3}$ to $10^{16}$ cm$^{-3}$.

The substrate structure may further include a semiconductor crystal layer disposed between the buffer layer and the porous semiconductor layer, the porous semiconductor layer and the semiconductor crystal layer may include a same semiconductor material, and the porous semiconductor layer may be doped with an impurity of a first conductivity type, and the semiconductor crystal layer may be undoped.

The porous semiconductor layer may include a plurality of first porous semiconductor layers having a plurality of voids and a plurality of second porous semiconductor layers without voids, and the plurality of second porous semiconductor layers may be alternately stacked with the plurality of first porous semiconductor layers.

An upper surface of the porous semiconductor layer may be patterned in a form of a vertical nanorod extending downward of the plurality of semiconductor light emitting structures, and the passivation film may be disposed on the upper surface of the porous semiconductor layer between the plurality of semiconductor light emitting structures.

The substrate structure may further include an etch-resistant layer disposed between the porous semiconductor layer and the plurality of semiconductor light emitting structures, an upper surface of the porous semiconductor layer and the etch-resistant layer may be patterned in a form of a plurality of vertical nanorods respectively extending downwards of the plurality of semiconductor light emitting structures, and each diameter of the patterned nanorod of the porous semiconductor layer and the etch-resistant layer may be greater than each diameter of the plurality of semiconductor light emitting structures.

According to another aspect of an example embodiment, there is provided a nanorod light emitting device including a semiconductor light emitting structure having a nanorod shape, and a passivation film disposed on a sidewall of the semiconductor light emitting structure and having an insulation property, wherein the semiconductor light emitting structure includes a porous semiconductor layer having a plurality of voids, a first semiconductor layer disposed on the porous semiconductor layer and doped with an impurity of a first conductivity type, a light emitting layer disposed on the first semiconductor layer and having a multi-quantum well structure, a second semiconductor layer disposed on the light emitting layer and doped with an impurity of a second conductivity type that is electrically opposite to the first conductivity type; and an electrode disposed on the second semiconductor layer.

The semiconductor light emitting structure may have a height ranging from 1 μm to 20 μm, and a diameter ranging from 0.05 μm to 1 μm.

The nanorod light emitting device may further include a superlattice layer disposed between the first semiconductor layer and the light emitting layer, wherein the superlattice layer may include a plurality of first layers including a same material as a material of the first semiconductor layer, and a plurality of second layers including a same material as a material of the light emitting layer, the plurality of second layers being alternately stacked with the plurality of first layers.

The nanorod light emitting device may further include a planarization layer disposed between the porous semiconductor layer and the first semiconductor layer, wherein the porous semiconductor layer and the planarization layer may include a same semiconductor material, and wherein the porous semiconductor layer may be doped with an impurity of a first conductivity type, wherein the planarization layer may not be doped or doped with the impurity of the first conductivity type with a doping concentration lower than a doping concentration of the porous semiconductor layer.

The doping concentration of the porous semiconductor layer may range from $10^{18}$ cm$^{-3}$ to $10^{20}$ cm$^{-3}$, and the doping concentration of the planarization layer may range from 0 cm$^{-3}$ to $10^{16}$ cm$^{-3}$.

The nanorod light emitting device may further include an etch-resistant layer disposed between the porous semiconductor layer and the first semiconductor, wherein a diameter of the porous semiconductor layer and a diameter of the etch-resistant layer ay be greater than a diameter of the first semiconductor layer, a diameter of the light emitting layer, and a diameter of the second semiconductor layer.

The porous semiconductor layer may include a plurality of first porous semiconductor layers having a plurality of voids, and a plurality of second porous semiconductor layers without voids, the plurality of second porous semiconductor layers being alternately stacked with the plurality of first porous semiconductor layers.

According to another aspect of an example embodiment, there is provided a method of manufacturing a substrate structure, the method including forming a buffer layer on a substrate, forming a semiconductor material layer on the buffer layer, forming a porous semiconductor layer by generating a plurality of voids in the semiconductor material layer, forming a plurality of semiconductor light emitting structures having a nanorod shape disposed on the porous semiconductor layer and extending vertically, and forming a passivation film disposed on sidewalls of each of the plurality of semiconductor light emitting structures, the passivation film having insulating properties.

Each of the semiconductor light emitting structures may have a height ranging from 1 μm to 20 μm, and a diameter ranging from 0.05 μm to 1 μm.

The forming of the porous semiconductor layer may include immersing the semiconductor material layer formed on the buffer layer in an electrolyte solution, and applying a positive voltage to the semiconductor material layer formed on the buffer layer and applying a negative voltage to the electrolyte solution.

The forming of the semiconductor material layer on the buffer layer may include alternately stacking a first semiconductor material layer including indium and a second semiconductor material layer not including indium.

The forming of the porous semiconductor layer may include forming a plurality of voids based on precipitating indium in the first semiconductor material layer by annealing the semiconductor material layer formed on the buffer layer at a temperature between 800 degrees and 900 degrees in an atmosphere including hydrogen or nitrogen.

The method may further include forming a planarization layer on the semiconductor material layer between the forming of the semiconductor material layer on the buffer layer and the forming of the porous semiconductor layer.

The semiconductor material layer and the planarization layer formed on the buffer may include a same semiconductor material, and the semiconductor material layer stacked on the buffer layer may be doped with an impurity of a first conductivity type, and the planarization layer may be doped or undoped with an impurity of the first conductivity type with a doping concentration lower than a doping concentration of the porous semiconductor layer.

The method may further include forming a semiconductor crystal layer on the buffer layer between the forming of the buffer layer over the substrate and the forming of the semiconductor material layer on the buffer layer, the semiconductor material layer may be formed on the semiconductor crystal layer, the semiconductor material layer and the semiconductor crystal layer may include a same semiconductor material, the semiconductor material layer may be doped with an impurity of a first conductivity type, and the semiconductor crystal layer may be undoped.

The forming of the plurality of semiconductor light emitting structures may include forming a first semiconductor layer doped with an impurity of a first conductivity type on the porous semiconductor layer, forming a light emitting layer on the first semiconductor layer, forming a second semiconductor layer doped with an impurity of a second conductivity type that is electrically opposite to the first conductivity type on the light emitting layer, and patterning the first semiconductor layer, the light emitting layer, and the second semiconductor layer in a form of a plurality of nanorods.

The method may further include, before the forming of the light emitting layer on the first semiconductor layer, forming a superlattice layer on the porous semiconductor layer by alternately stacking a plurality of first layers including a same material as the material of the first semiconductor layer and a plurality of second layers including a same material as the material of the light emitting layer, wherein the light emitting layer is formed on the superlattice layer.

The patterning of the first semiconductor layer, the light emitting layer, and the second semiconductor layer may include etching an upper portion of the first semiconductor layer such that a lower portion of the first semiconductor layer extends horizontally along an upper surface of the porous semiconductor layer and lower portions of the first semiconductor layers of the plurality of semiconductor light emitting structures are connected to each other.

The patterning of the first semiconductor layer, the light emitting layer, and the second semiconductor layer may include etching an upper portion of the porous semiconductor layer such that the upper surface of the porous semiconductor layer is patterned in a form of a vertical nanorod extending downward of the plurality of semiconductor light emitting structures.

The method may further include, before the forming of the first semiconductor layer on the porous semiconductor layer, forming an etch-resistant layer on the porous semiconductor layer, wherein the first semiconductor layer is formed on the etch-resistant layer.

The patterning of the first semiconductor layer, the light emitting layer, and the second semiconductor layer may include etching to an upper portion of the first semiconductor layer such that the upper surface of the porous semiconductor layer and the etch-resistant layer are patterned in a form of a plurality of vertical nanorods respectively extending to lower portions of the plurality of semiconductor light emitting structures, and a diameter of the patterned nanorod of the porous semiconductor layer and a diameter of the etch-resistant layer may be greater than a diameter of each of the plurality of semiconductor light emitting structures.

According to another aspect of an example embodiment, there is provided a substrate structure including a substrate, a buffer layer disposed on the substrate, a porous semiconductor layer disposed on the buffer layer, the porous semiconductor layer having a plurality of voids, a plurality of semiconductor light emitting structures disposed on the porous semiconductor layer, the plurality of semiconductor light emitting structures having a nanorod shape extending vertically, and a passivation film disposed on a side wall of each of the plurality of semiconductor light emitting structures, the passivation film having an insulation property, wherein each of the plurality of semiconductor light emitting structures includes a first semiconductor layer disposed on the porous semiconductor layer and doped with an impurity of a first conductivity type, a light emitting layer disposed on the first semiconductor layer and having a multi-quantum well structure, a superlattice layer disposed between the first semiconductor layer and the light emitting layer, a second semiconductor layer disposed on the light emitting layer and doped with an impurity of a second conductivity type that is electrically opposite to the first conductivity type, and an electrode disposed on the second semiconductor layer.

BRIEF DESCRIPTION OF THE DRAWINGS

The above and other aspects, features, and advantages of example embodiments of the disclosure will be more apparent from the following description taken in conjunction with the accompanying drawings, in which.

DETAILED DESCRIPTION

Figure 1A:
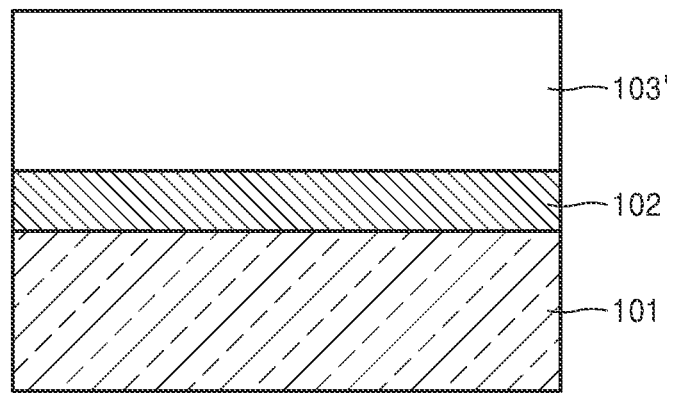
FIGS. 1A, 1B, 1C, 1D, 1E, 1F, 1G, and 1H are cross-sectional views illustrating an example of a method of manufacturing a plurality of nanorod light emitting devices and a substrate structure including the plurality of nanorod light emitting devices according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a nanorod light emitting device, a substrate structure including a plurality of nanorod light emitting devices, and a method of manufacturing the substrate structure will be described in detail with reference to the accompanying drawings. In the following drawings, the same reference numerals refer to the same components, and the size of each component in the drawings may be exaggerated for clarity and convenience of description. Further, the example embodiments described below are merely exemplary, and various modifications are possible from these example embodiments.

Hereinafter, what is described as "upper part" or "on" may include not only those directly above by contact, but also those above non-contact. The terms of a singular form may include plural forms unless otherwise specified. In addition, when a certain part "includes" a certain component, it means that other components may be further included rather than excluding other components unless otherwise stated.

The use of the term "the" and similar designating terms may correspond to both the singular and the plural. If there is no explicit order or contradictory statement about the steps constituting the method, these steps may be performed in an appropriate order, and are not necessarily limited to the order described.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

The use of all examples or illustrative terms is merely for describing technical ideas in detail, and the scope is not limited by these examples or illustrative terms unless limited by the claims.

FIGS. 1A to 1H are cross-sectional views illustrating a method of manufacturing a plurality of nanorod light emitting devices and a substrate structure including the plurality of nanorod light emitting devices according to an example embodiment.

Referring to FIG. 1A, a buffer layer 102 and a semiconductor material layer 103' for a porous semiconductor layer are sequentially grown on a substrate 101. The buffer layer 102 is disposed over a large area of an upper surface of the substrate 101, and the semiconductor material layer 103' may be grown over the entire upper surface of the buffer layer 102. The substrate 101 may include sapphire, silicon (Si), or gallium arsenide (GaAs). The buffer layer 102 may include aluminum gallium nitride (AlGaN) or aluminum nitride (AlN). For example, the semiconductor material layer 103' may include GaN. In particular, the semiconductor material layer 103' may be n-type doped with a high concentration so that voids may be formed in the semiconductor material layer 103' in the subsequent electrochemical etching process. For example, the semiconductor material layer 103' may be doped with a doping concentration of about $10^{18}$ cm$^{-3}$ to about $10^{20}$ cm$^{-3}$ using silicon (Si) as a dopant.

Figure 1B:
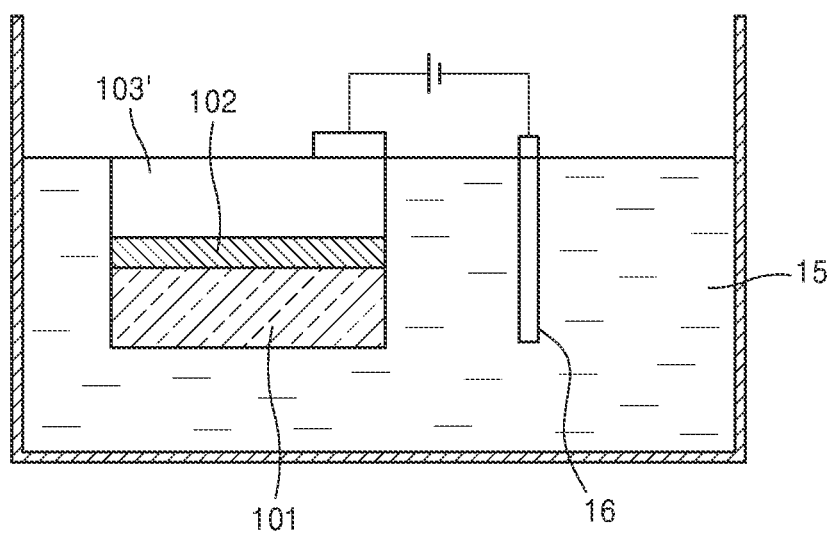

Referring to FIG. 1B, the semiconductor material layer 103' formed on the buffer layer 102 may be immersed in the electrolyte solution 15. As the electrolyte solution 15, for example, about 0.2M oxalic acid solution or about 0.3M sodium nitrate (NaNO$_3$) solution may be used. Then, a positive voltage may be applied to the semiconductor material layer 103' and a negative voltage may be applied to the electrolyte solution 15. The cathode 16 may be immersed in the electrolyte solution 15. The material of the cathode 16 may be, for example, platinum (Pt).

Figure 1C:
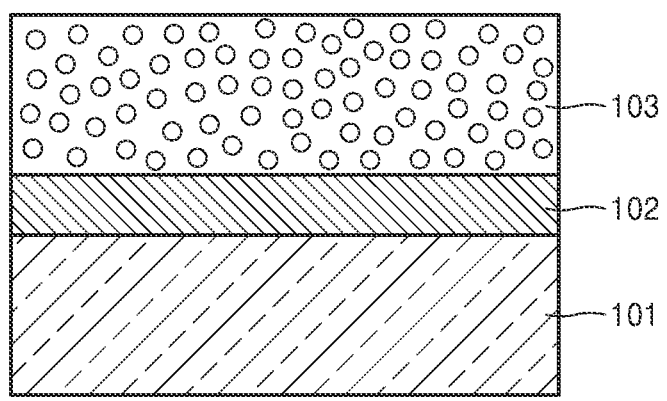

Then, some gallium nitride (GaN) in the semiconductor material layer 103' is decomposed to form a plurality of voids in the semiconductor material layer 103'. Accordingly, as shown in FIG. 1C, the porous semiconductor layer 103 having a plurality of voids on the buffer layer 102 may be formed. The number of voids formed in the porous semiconductor layer 103 may be adjusted according to the intensity of the voltage applied to the semiconductor material layer 103' or the amount of time the voltage is applied.

Figure 1D:
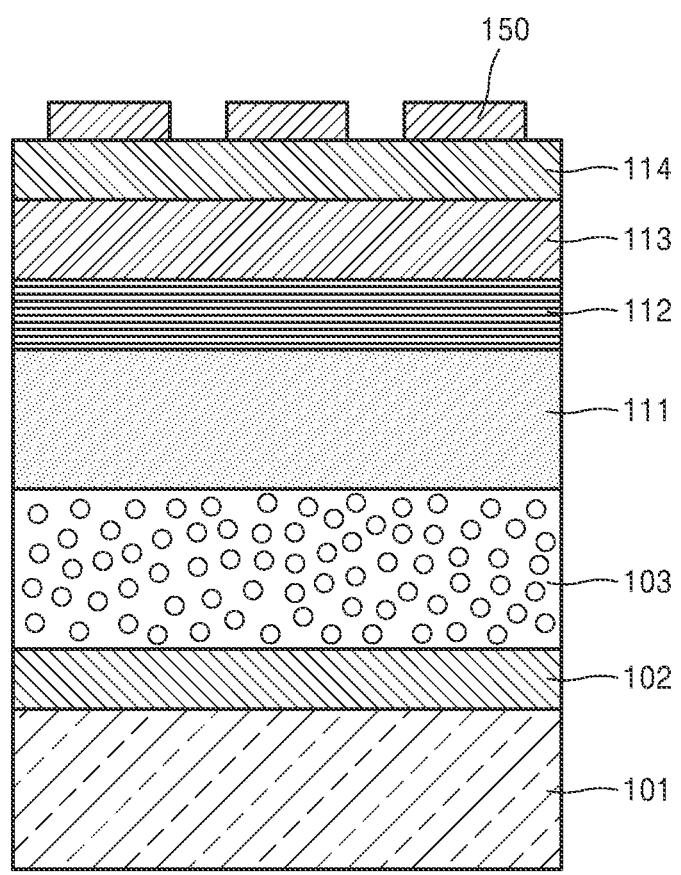

Then, referring to FIG. 1D, a first semiconductor layer 111, a light emitting layer 112, and a second semiconductor layer 113 may be sequentially grown on the porous semiconductor layer 103. In addition, the electrode 114 may be formed on the second semiconductor layer 113. The first semiconductor layer 111 may be grown on the entire upper surface of the porous semiconductor layer 103, and the light emitting layer 112 may be grown on the entire upper surface of the first semiconductor layer 111. Likewise, the second semiconductor layer 113 and the electrode 114 may each be grown to be disposed over the entire upper surface of the underlying layer. The electrode 114 may be made of a transparent conductive material such as indium tin oxide (ITO), indium zinc oxide (IZO) fluoride tin oxide (FTO), but is not limited thereto.

The first semiconductor layer 111 may include at least one semiconductor material selected from n-AlGaN, n-AlInGaN, n-AlGaN, and n-GaN. Accordingly, the first semiconductor layer 111 may be doped with the same conductivity type as the porous semiconductor layer 103. Also, the second semiconductor layer 113 may include at least one semiconductor material selected from p-AlGaN, p-AlInGaN, p-AlGaN, and p-GaN. Accordingly, the first semiconductor layer 111 is a single layer made of a semiconductor material of a single composition, and the second semiconductor layer 113 is also a single layer made of a semiconductor material of a single composition. However, the first semiconductor layer 111, and the porous semiconductor layer 103 and the second semiconductor layer 113 are doped with opposite conductivity types. For example, the n-type first semiconductor layer 111 may be doped with silicon (Si), and the p-type second semiconductor layer 113 may be doped using zinc (Zn) as a dopant.

The light emitting layer 112 has a quantum well structure in which quantum wells are disposed between barriers. Light may be generated as electrons and holes provided from the first and second semiconductor layers 111 and 113 are recombined in the quantum well in the light emitting layer 112. The wavelength of light generated from the light emitting layer 112 may be determined according to the energy band gap of the material constituting the quantum well in the light emitting layer 112. The light emitting layer 112 may have one quantum well, but embodiments are not limited thereto, and the light emitting layer 112 may have a multi-quantum well (MQW) structure in which a plurality of quantum wells and a plurality of barriers are alternately arranged. The thickness of the light emitting layer 112 or the number of quantum wells in the light emitting layer 112 may be appropriately selected in consideration of the driving voltage and luminous efficiency of the light emitting device. For example, the thickness of the light emitting layer 112 may be selected to be equal to or less than twice the diameter of the light emitting layer 112.

The light emitting layer 112 may include, for example, a quantum well made of $In_xGa_{1-x}N$ (1>x>=0.25) and a barrier made of $In_yGa_{1-y}N$ (0<=y<0.15). As the composition of indium (In) in the quantum well increases, the emission wavelength increases, and the lattice constant of the quantum well also increases. When the lattice constant of the quantum well increases, the difference in lattice constant with the material of the first semiconductor layer 111 positioned below the light emitting layer 112 increases. The porous semiconductor layer 103 may relieve tensile strain due to the lattice constant difference between the semiconductor material used as the light emitting layer 112 and the semiconductor material of the first semiconductor layer 111 under the light emitting layer 112. In particular, the porous semiconductor layer 103 is used when x is 0.25 or more, or when x is 0.35 or more, so that stress due to the lattice constant difference described above may be relieved.

After the electrode 114 is formed, a hard mask 150 having a plurality of openings arranged at regular intervals is formed on the electrode 114. For example, after the material of the hard mask 150 is entirely formed on the upper surface of the electrode 114, in order to have a plurality of openings arranged at regular intervals using a lithographic method, the hard mask 150 may be formed by patterning the material of the hard mask 150. The hard mask 150 may be formed of, for example, a single layer of silicon oxide ($SiO_2$) or a double layer of $SiO_2$/Al. For example, the hard mask 150 may have a plurality of two-dimensionally arranged openings when viewed from the top.

Figure 1E:
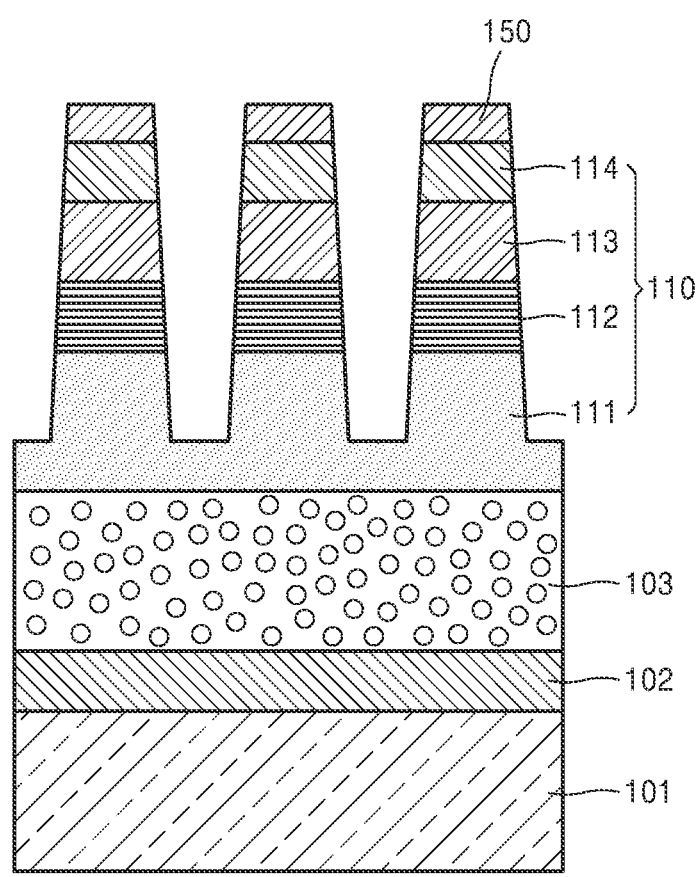

Referring to FIG. 1E, areas not covered with the hard mask 150 may be removed by etching using a dry etching method. For example, by sequentially dry etching and removing the electrode 114, the second semiconductor layer 113, the light emitting layer 112, and the first semiconductor layer 111 under the opening of the hard mask 150, the electrode 114, the second semiconductor layer 113, the light emitting layer 112, and the first semiconductor layer 111 may be patterned in the form of a plurality of nanorods. Then, as shown in FIG. 1E, a plurality of semiconductor light emitting structures 110 having a nanorod shape each including the first semiconductor layer 111, the light emitting layer 112, the second semiconductor layer 113, and the electrode 114 may be formed all at once on the porous semiconductor layer 103.

The dry etching described above may be performed only up to the upper portion of the first semiconductor layer 111, and the etching may be stopped at the lower portion of the first semiconductor layer 111. Then, the lower area of the first semiconductor layer 111 may remain without being completely etched. In this case, the lower portion of the first semiconductor layer 111 may extend laterally along the upper surface of the porous semiconductor layer 103 so that the lower portions of the first semiconductor layers 111 of the plurality of semiconductor light emitting structures 110 may be connected to each other.

Figure 1F:
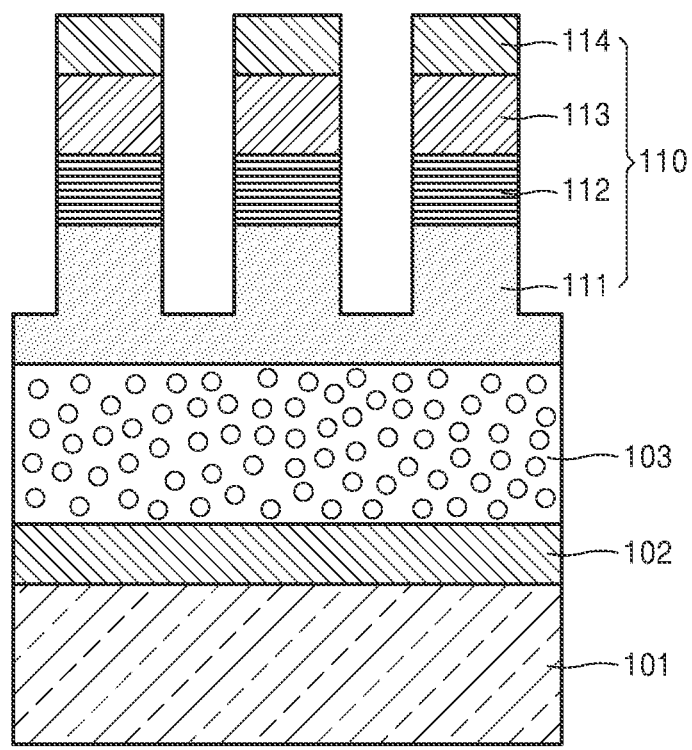

The semiconductor light emitting structures 110 formed in FIG. 1E may have a shape in which a diameter gradually decreases along a height direction from the first semiconductor layer 111 to the electrode 114. Referring to FIG. 1F, for example, through a wet treatment using a potassium hydroxide (KOH) solution or a tetramethyl ammonium hydrooxide (TMAH) solution, diameters of the semiconductor light emitting structures 110 may be made uniform along the height direction. In this process, the hard mask 150 may also be removed.

Figure 1G:
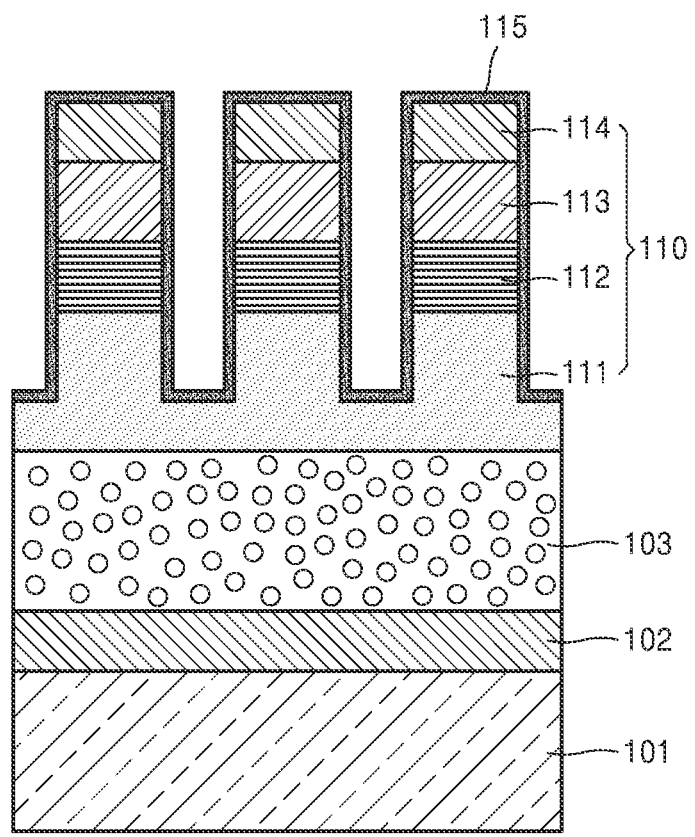

Referring to FIG. 1G, a passivation film 115 may be formed with a uniform thickness on the surface of the semiconductor light emitting structure 110. The passivation film 115 may serve to protect the semiconductor light emitting structure 110 from external physical and chemical impact and also to insulate the semiconductor light emitting structure 110 to prevent leakage of current. For example, the passivation film 115 may simply be made of an insulator material.

According to another example embodiment, the passivation film 115 may include an insulating crystalline material having the substantially same crystal structure as that of the light emitting layer 112. In particular, the passivation film 115 may have a lattice matching epitaxy relationship or a domain matching epitaxy relationship with the light emitting layer 112. The lattice matching epitaxial relationship may be a relationship in which the lattice constant of the passivation film 115 is substantially identical to the lattice constant of the light emitting layer 112. In addition, the domain matching epitaxy relationship may be a relationship in which the lattice constant of the passivation film 115 is approximately equal to an integer multiple of the lattice constant of the light emitting layer 112, or the lattice constant of the light emitting layer 112 is almost identical to an integer multiple of the lattice constant of the passivation film 115. In this case, because atoms located on the outer surface of the light emitting layer 112 may mostly be combined with the atoms of the passivation film 115, dangling bonds on the outer surface of the light emitting layer 112 may be reduced, and thus surface defects may also be reduced. Accordingly, a current may flow relatively uniformly in the entire area of the light emitting layer 112 and light emission may occur relatively uniformly in the entire area of the light emitting layer 112. Accordingly, the luminous efficiency of the light emitting layer 112 may be increased. As such, the passivation film 115 having an epitaxial relationship with the light emitting layer 112 may include at least one material of zirconium oxide (ZrO), strontium oxide (SrO), magnesium oxide (MgO), barium oxide (BaO), cerium oxide ($CeO_2$), gadolinium oxide ($Gd_2O_3$), oxocalcium (CaO), hafnium oxide ($HfO_2$), titanium oxide ($TiO_2$), aluminum oxide ($AlO_x$), barium oxide (BaN), silicon nitride (SiN), titanium oxide (TiN), cerium nitride (CeN), AlN, zinc selenide (ZnSe), zinc sulfide (ZnS), AlGaN, and $Al_xGa_{1-x}As$ (x≥0.9), for example.

Figure 1H:
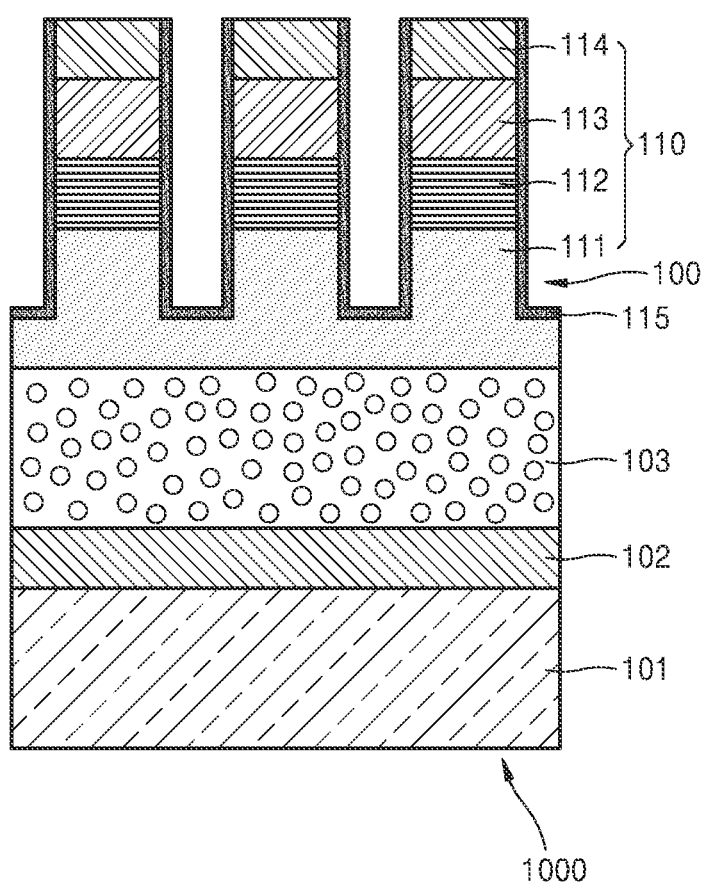

Referring to FIG. 1H, the passivation film 115 present on the upper surface of the semiconductor light emitting structure 110 may be removed. The remaining passivation film 115 may be provided adjacent to and surround the sidewall of the semiconductor light emitting structure 110. In addition, a portion of the passivation film 115 may extend over the exposed upper surface of the first semiconductor layer 111 between the plurality of semiconductor light emitting structures 110.

In this way, a plurality of nanorod light emitting devices 100 having a nanorod shape and a substrate structure 1000 including the plurality of nanorod light emitting devices 100 may be formed. The substrate structure 1000 may include a substrate 101, a buffer layer 102 disposed over the substrate 101, a porous semiconductor layer 103 disposed over the buffer layer 102, and a plurality of nanorod light emitting devices 100 vertically disposed on the porous semiconductor layer 103. In addition, each nanorod light emitting device 100 may include a semiconductor light emitting structure 110 disposed on the porous semiconductor layer 103 and a passivation film 115 surrounding a sidewall of the semiconductor light emitting structure 110. The plurality of nanorod light emitting devices 100 may be two-dimensionally arranged on the porous semiconductor layer 103.

The plurality of nanorod light emitting devices 100 may be individually separated from the substrate structure 1000 through dicing. Although the nanorod light emitting device 100 individually separated from the substrate structure 1000 may be distributed/traded, the substrate structure 1000 itself may be distributed/traded. For example, a manufacturer of a display device purchases a substrate structure 1000 on which a plurality of nanorod light emitting devices 100 are formed, and may manufacture a display device by separating the nanorod light emitting devices 100 from the substrate structure 1000.

Figure 2:
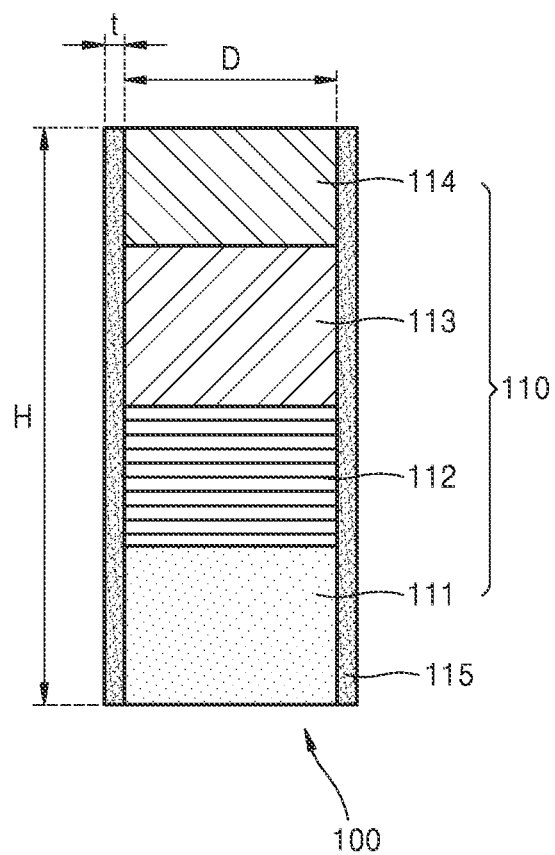
FIG. 2 is a cross-sectional view showing a schematic configuration of a nanorod light emitting device according to an example embodiment.

FIG. 2 is a cross-sectional view showing a schematic configuration of a nanorod light emitting device according to an example embodiment. In particular, FIG. 2 shows the configuration of the nanorod light emitting device 100 separated from the substrate structure 1000 shown in FIG. 1H. Referring to FIG. 2, the nanorod light emitting device 100 may include a semiconductor light emitting structure 110 having a nanorod shape and a passivation film 115 surrounding a sidewall of the semiconductor light emitting structure 110. The semiconductor light emitting structure 110 includes a first semiconductor layer 111, a light emitting layer 112 disposed on the first semiconductor layer 111, and a second semiconductor layer 113 disposed on the light emitting layer 112. In addition, the semiconductor light emitting structure 110 may further include an electrode 114 disposed on the second semiconductor layer 113. The semiconductor light emitting structure 110 may further include a contact layer disposed between the second semiconductor layer 113 and the electrode 114.

As described above, the semiconductor light emitting structure 110 may have a nanorod shape having a very small size of a nano-scale or a micro-scale. For example, the semiconductor light emitting structure 110 may have a diameter D in the range of about 0.05 μm to about 1 μm. The semiconductor light emitting structure 110 having a nanorod shape may have a substantially uniform diameter along the height direction. For example, diameters of the first semiconductor layer 111, the light emitting layer 112, the second semiconductor layer 113, and the electrode 114 may be substantially the same. In addition, when the length between the lower surface of the first semiconductor layer 111 and the upper surface of the electrode 114 is the height H of the semiconductor light emitting structure 110, the height H of the semiconductor light emitting structure 110 may be approximately in the range of about 1 μm to about 20 μm. In addition, the semiconductor light emitting structure 110 may have, for example, a large aspect ratio of 5 or more. For example, the semiconductor light emitting structure 110 may have a diameter D of about 500 nm to about 600 nm and a height H of about 4 μm to about 5 μm.

Because the size of the nanorod light emitting device 100 is very small, strain due to stress may have a significant effect on the performance of the nanorod light emitting device 100. According to the example embodiment, by forming the semiconductor light emitting structure 110 on the porous semiconductor layer 103 having a plurality of voids, the porous semiconductor layer 103 may relieve stress and strain caused by a lattice constant difference between layers in the semiconductor light emitting structure 110. Then, because the light emitting layer 112 may be formed at a high temperature, for example, about 700° C. or higher, crystallinity of the light emitting layer 112 may be improved. Accordingly, even when the nanorod light emitting device 100 is manufactured on a nano scale, the luminous efficiency of the nanorod light emitting device 100 does not decrease or the decrease in luminous efficiency may be minimized.

Figure 3:
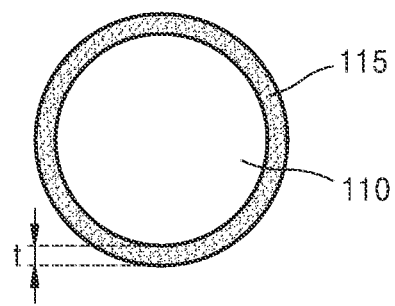
FIG. 3 is a plan view of a nanorod light emitting device shown in FIG. 2.

FIG. 3 is a plan view of the nanorod light emitting device 100 shown in FIG. 2. Referring to FIG. 3, the passivation film 115 may be disposed to completely surround the sidewall of the semiconductor light emitting structure 110. Therefore, the passivation film 115 may have a ring shape in a plan view, and may have a cylindrical shape as a whole. Although the semiconductor light emitting structure 110 is illustrated as having a circular shape in FIG. 3, embodiments are not limited thereto. The thickness t of the passivation film 115 according to the diameter direction of the nanorod light emitting device 100, that is, the distance between the inner sidewall and the outer sidewall of the passivation film 115, may be in the range of about 5 nm to about 70 nm.

Figure 4A:
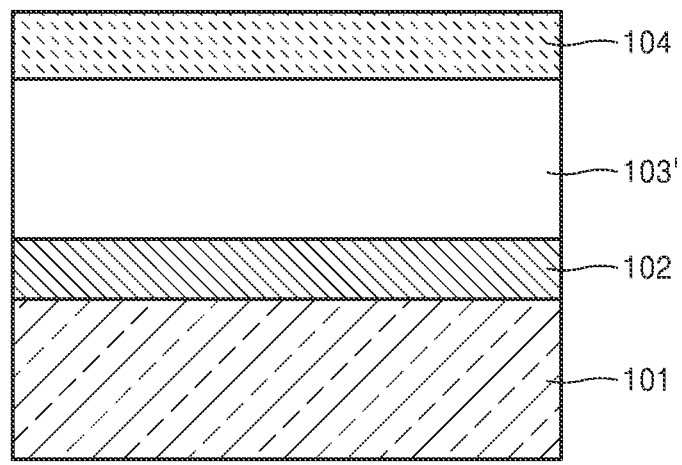
FIGS. 4A, 4B, and 4C are cross-sectional views illustrating an example of a method of manufacturing a plurality of nanorod light emitting devices and a substrate structure including the plurality of nanorod light emitting devices according to another example embodiment.
Figure 4B:
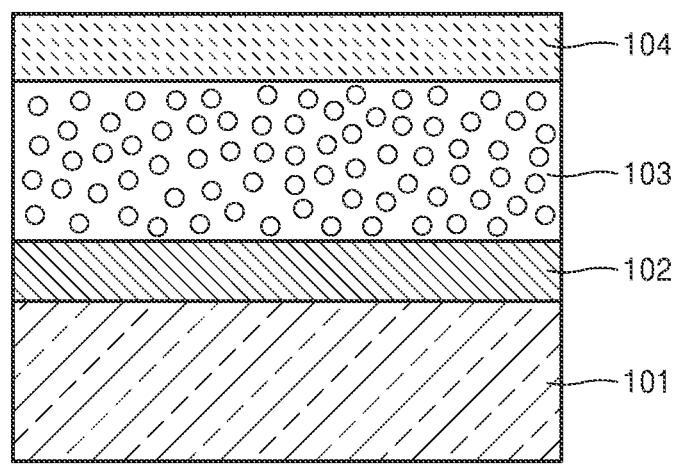
Figure 4C:
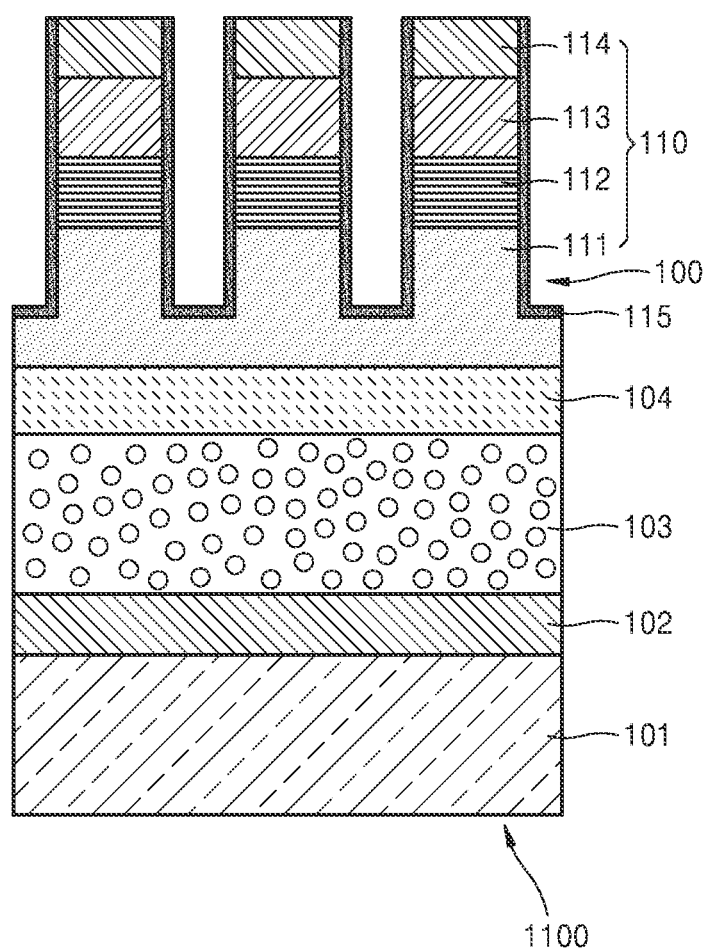

FIGS. 4A to 4C are cross-sectional views illustrating a plurality of nanorod light emitting devices and a substrate structure including the plurality of nanorod light emitting devices according to another example embodiment.

Referring to FIG. 4A, after the buffer layer 102 and the semiconductor material layer 103' are grown on the substrate 101, a planarization layer 104 may be further grown on the semiconductor material layer 103'. The planarization layer 104 may be grown over the entire upper surface of the semiconductor material layer 103'. The planarization layer 104 may be made of the same semiconductor material as the semiconductor material layer 103'. The planarization layer 104 may be undoped or doped with the same conductivity type as the semiconductor material layer 103'. When the planarization layer 104 is doped, the doping concentration of the planarization layer 104 may be lower than that of the semiconductor material layer 103'. For example, the planarization layer 104 may be doped with a doping concentration of about 0 cm$^{-3}$ to about $10^{16}$ cm$^{-3}$ using silicon (Si) as a dopant.

Then, when the electrochemical etching shown in FIG. 1B is performed, voids are formed only in the semiconductor material layer 103' with a high doping concentration, and voids are hardly formed in the undoped or low-doping planarization layer 104. Accordingly, as shown in FIG. 4B, the porous semiconductor layer 103 may be formed between the buffer layer 102 and the planarization layer 104. The porous semiconductor layer 103 may have the same properties as the semiconductor material layer 103' described above, except the voids. For example, the porous semiconductor layer 103 is doped with n-type, and may have a doping concentration higher than that of the planarization layer 104. Because few voids are formed in the planarization layer 104, the planarization layer 104 may provide a flat and smooth surface for the first semiconductor layer 111 grown thereon.

Then, the process described with reference to FIGS. 1D to 1H may be performed to form a plurality of nanorod light emitting devices and a substrate structure. For example, after sequentially forming a first semiconductor layer 111, a light emitting layer 112, a second semiconductor layer 113, and an electrode 114 on the planarization layer 104, a plurality of semiconductor light emitting structures 110 may be formed by patterning the first semiconductor layer 111, the light emitting layer 112, the second semiconductor layer 113, and the electrode 114 by dry etching. In addition, a passivation film 115 may be formed on a sidewall of the semiconductor light emitting structure 110.

Referring to FIG. 4C, the substrate structure 1100 may include a substrate 101, a buffer layer 102, a porous semiconductor layer 103, a planarization layer 104, and a plurality of nanorod light emitting devices 100 each having a semiconductor light emitting structure 110 and a passivation film 115. Compared with the substrate structure 1000 illustrated in FIG. 1H, the substrate structure 1100 illustrated in FIG. 4C may further include the planarization layer 104 disposed between the porous semiconductor layer 103 and the plurality of semiconductor light emitting structures 110.

Figure 5A:
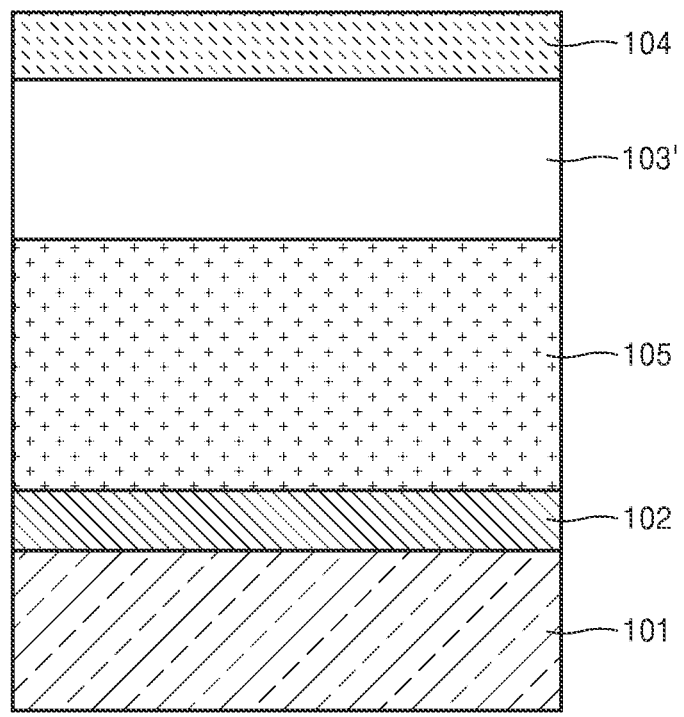
FIGS. 5A, 5B, and 5C are cross-sectional views illustrating an example of a method of manufacturing a substrate structure including a plurality of nanorod light emitting devices according to another example embodiment.
Figure 5B:
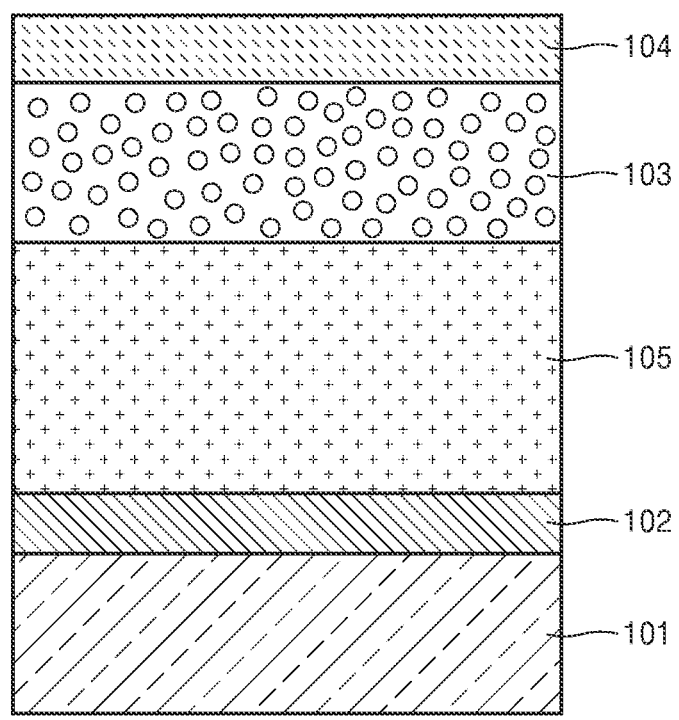
Figure 5C:
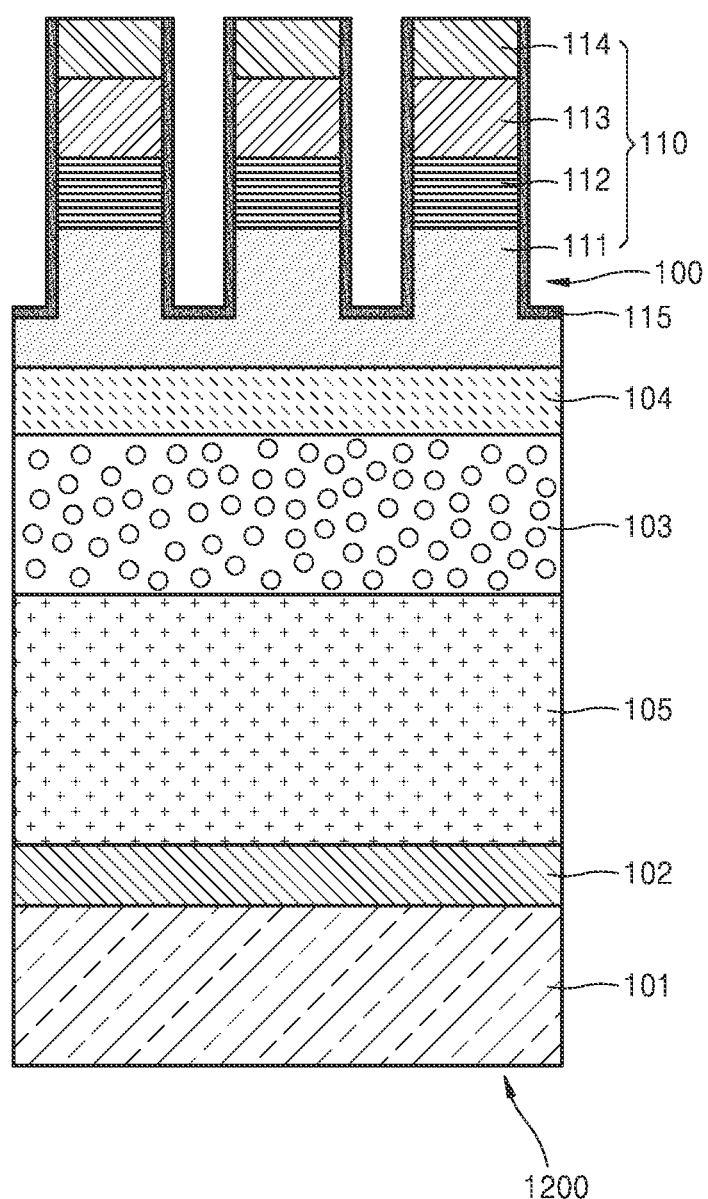

FIGS. 5A to 5C are cross-sectional views illustrating a method of manufacturing a plurality of nanorod light emitting devices and a substrate structure including the plurality of nanorod light emitting devices according to another example embodiment.

Referring to FIG. 5A, a semiconductor crystal layer 105 may be further grown between the buffer layer 102 and the semiconductor material layer 103'. For example, after the buffer layer 102 is grown on the substrate 101 and the semiconductor crystal layer 105 is grown on the buffer layer 102, a semiconductor material layer 103' may be grown over the semiconductor crystal layer 105. The semiconductor crystalline layer 105 may be grown over the entire upper surface of the buffer layer 102, and the semiconductor material layer 103' may be grown over the entire upper surface of the semiconductor crystalline layer 105. The semiconductor crystal layer 105 may be made of the same semiconductor material as the semiconductor material layer 103' and may be undoped. For example, the semiconductor material of the semiconductor crystal layer 105 may include u-GaN.

FIG. 5A illustrates that a planarization layer 104 is further formed on the semiconductor material layer 103', however, embodiments are not limited thereto, and the semiconductor crystal layer 105 and the planarization layer 104 may not necessarily be included together. For example, the planarization layer 104 may be omitted in FIG. 5A.

Then, when electrochemical etching shown in FIG. 1B is performed, voids are formed only in the semiconductor material layer 103' having a high doping concentration, and almost no voids are formed in the undoped semiconductor crystal layer 105. Accordingly, as shown in FIG. 5B, the porous semiconductor layer 103 may be formed on the semiconductor crystal layer 105 or between the semiconductor crystal layer 105 and the planarization layer 104. The semiconductor crystal layer 105 may serve to improve crystallinity of layers formed thereon.

Then, the process described with reference to FIGS. 1D to 1H may be performed to form a plurality of nanorod light emitting devices and a substrate structure. Referring to FIG. 5C, the substrate structure 1200 formed in this way may include a substrate 101, a buffer layer 102, a semiconductor crystal layer 105, a porous semiconductor layer 103, and a plurality of nanorod light emitting devices 100 each having a semiconductor light emitting structure 110 and a passivation film 115. The substrate structure 1200 may further include the planarization layer 104 disposed between the porous semiconductor layer 103 and the plurality of semiconductor light emitting structures 110. Compared with the substrate structure 1000 illustrated in FIG. 1H, the substrate structure 1200 illustrated in FIG. 5C may further include a semiconductor crystal layer 105 disposed between the buffer layer 102 and the porous semiconductor layer 103.

Figure 6:
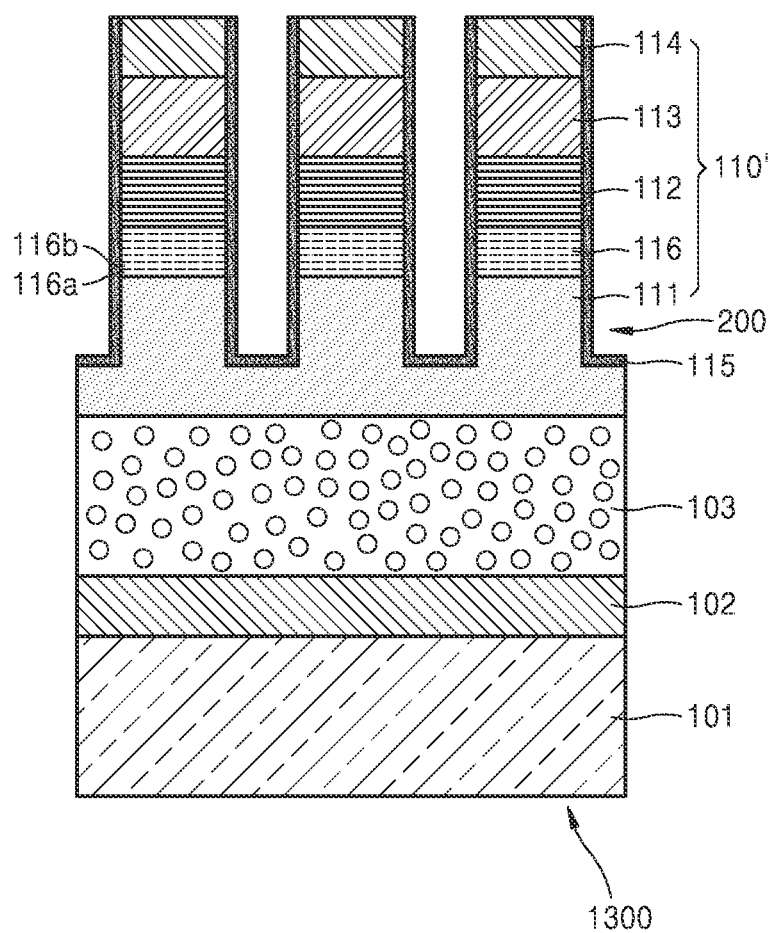
FIG. 6 is a cross-sectional view schematically showing a substrate structure including a plurality of nanorod light emitting devices according to another example embodiment.

FIG. 6 is a cross-sectional view schematically showing a substrate structure including a plurality of nanorod light emitting devices according to another example embodiment. Referring to FIG. 6, the substrate structure 1300 may include a substrate 101, a buffer layer 102 disposed over the substrate 101, a porous semiconductor layer 103 disposed over the buffer layer 102, and a plurality of nanorod light emitting devices 200 disposed on the porous semiconductor layer 103. The substrate structure 1300 may further include a planarization layer 104 shown in FIG. 4C or a semiconductor crystal layer 105 shown in FIG. 5C. Each nanorod light emitting device 200 may include a semiconductor light emitting structure 110' disposed on the porous semiconductor layer 103 and a passivation film 115 surrounding a sidewall of the semiconductor light emitting structure 110'.

Each semiconductor light emitting structure 110' may include a first semiconductor layer 111 disposed on the porous semiconductor layer 103, a superlattice layer 116 disposed on the first semiconductor layer 111, a light emitting layer disposed on the superlattice layer 116, a second semiconductor layer 113 disposed on the light emitting layer 112, and an electrode 114 disposed on the second semiconductor layer 113. Therefore, compared to the semiconductor light emitting structure 110 shown in FIG. 1H, the semiconductor light emitting structure 110' illustrated in FIG. 6 may further include a superlattice layer 116 disposed between the first semiconductor layer 111 and the light emitting layer 112. In order to form the semiconductor light emitting structure 110' shown in FIG. 6, in the process shown in FIG. 1D, a first semiconductor layer 111, a superlattice layer 116, a light emitting layer 112, a second semiconductor layer 113, and an electrode 114 may be sequentially formed on the porous semiconductor layer 103. After that, by patterning the first semiconductor layer 111, the superlattice layer 116, the light emitting layer 112, the second semiconductor layer 113, and the electrode 114, a plurality of semiconductor light emitting structures 110' may be formed.

The superlattice layer 116 may include a plurality of first layers 116a and a plurality of second layers 116b that are alternately stacked on the first semiconductor layer 111 one by one. The first layer 116a may include the same material as the material of the first semiconductor layer 111, and the second layer 116b may include the same material as the material of the light emitting layer 112. In particular, the second layer 116b may include the same material as that of the barrier of the light emitting layer 112. For example, the first layer 116a may include GaN and the second layer 116b may include $In_yGa_{1-y}N$ ($0<=y<0.15$). The superlattice layer 116 may include, for example, 20 to 40 pairs of the first layer 116a and the second layer 116b. The superlattice layer 116 may further relieve stress due to a difference in lattice constant between the first semiconductor layer 111 and the light emitting layer 112. Although FIG. 6 illustrates that the first layer 116a is disposed at the bottom, embodiments are not limited thereto, and the arrangement order of the first layer 116a and the second layer 116b may be reversed.

Figure 7:
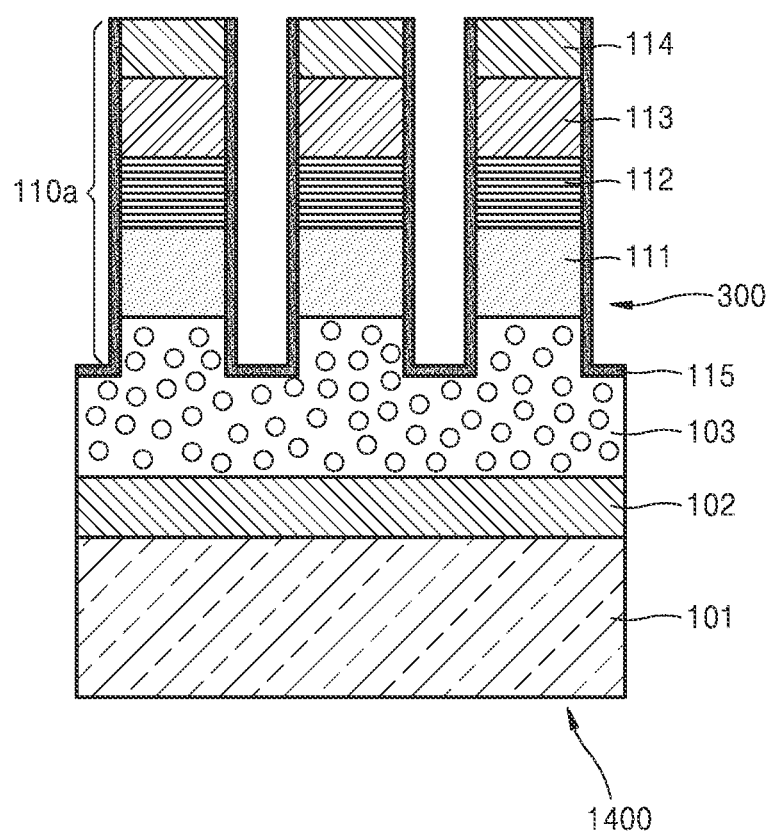
FIG. 7 is a cross-sectional view schematically showing a substrate structure including a plurality of nanorod light emitting devices according to another example embodiment.

FIG. 7 is a cross-sectional view schematically showing a substrate structure including a plurality of nanorod light emitting devices according to another example embodiment. In the patterning process shown in FIGS. 1E and 1F, it has been described that the etching is stopped at the lower portion of the first semiconductor layer 111 without completely etching the first semiconductor layer 111. In this case, the semiconductor light emitting structure 110 having a nanorod shape starts from the patterned upper portion of the first semiconductor layer 111. However, after the first semiconductor layer 111 is completely etched until the porous semiconductor layer 103 is exposed, the etching may be stopped at a lower portion of the porous semiconductor layer 103. Then, when the passivation film 115 is formed in the manner shown in FIGS. 1G and 1H, the substrate structure 1400 shown in FIG. 7 may be provided.

Referring to FIG. 7, the first semiconductor layers 111 of the plurality of nanorod light emitting devices 300 of the substrate structure 1400 are completely separated from each other. In addition, an upper portion of the porous semiconductor layer 103 between the plurality of nanorod light emitting devices 300 is partially etched. Accordingly, the upper surface of the porous semiconductor layer 103 may be patterned in the form of a vertical nanorod extending downward of the plurality of semiconductor light emitting structures 110a, and the semiconductor light emitting structure 110a in the form of a nanorod starts from the patterned upper portion of the porous semiconductor layer 103. The lower portion of the porous semiconductor layer 103 may remain completely unetched. Accordingly, the lower portion of the porous semiconductor layer 103 may extend laterally along the upper surface of the buffer layer 102 to be connected to each other. In addition, a portion of the passivation film 115 may extend over the upper surface of the porous semiconductor layer 103 between the plurality of semiconductor light emitting structures 110a.

Figure 8:
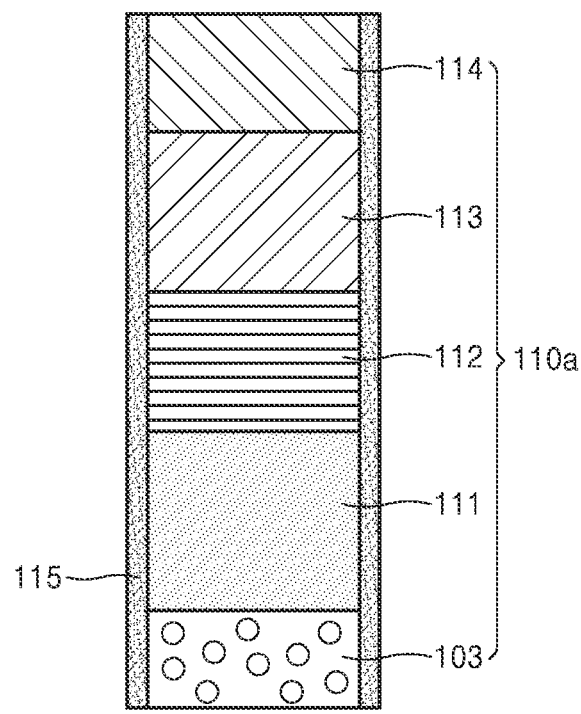
FIG. 8 is a cross-sectional view showing a schematic configuration of a nanorod light emitting device according to another example embodiment.

FIG. 8 is a cross-sectional view showing a schematic configuration of a nanorod light emitting device according to another example embodiment. In particular, FIG. 8 exemplarily shows the configuration of the nanorod light emitting device 300 separated from the substrate structure 1400 shown in FIG. 7. Referring to FIG. 8, the nanorod light emitting device 300 may include a nanorod-shaped semiconductor light emitting structure 110a and a passivation film 115 surrounding a sidewall of the semiconductor light emitting structure 110a. The semiconductor light emitting structure 110a may include a porous semiconductor layer 103, a first semiconductor layer 111 disposed on the porous semiconductor layer 103, a light emitting layer 112 disposed on the first semiconductor layer 111, a second semiconductor layer 113 disposed on the light emitting layer 112, and an electrode 114 disposed on the second semiconductor layer 113. The remaining configuration of the nanorod light emitting device 300 may be the same as that of the nanorod light emitting device 100 shown in FIG. 2.

Figure 9:
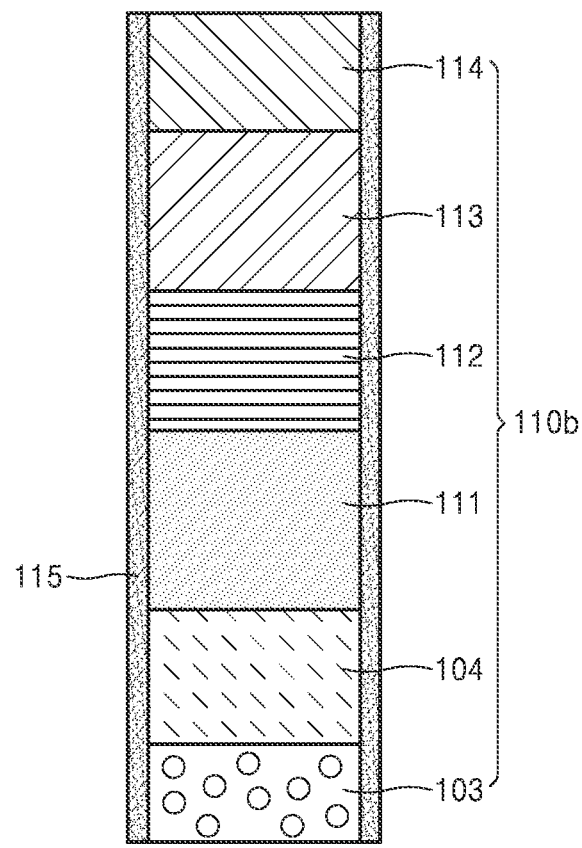
FIG. 9 is a cross-sectional view showing a schematic configuration of a nanorod light emitting device according to another example embodiment.

FIG. 9 is a cross-sectional view showing a schematic configuration of a nanorod light emitting device according to another example embodiment. In particular, FIG. 9 exemplarily shows the configuration of the nanorod light emitting device 400 formed by applying a process of patterning up to the upper surface of the porous semiconductor layer 103 to the substrate structure 1100 illustrated in FIG. 4C or the substrate structure 1200 illustrated in FIG. 5C. Referring to FIG. 9, the nanorod light emitting device 400 may include a semiconductor light emitting structure 110b and a passivation film 115. Compared with the semiconductor light emitting structure 110a shown in FIG. 8, the semiconductor light emitting structure 110b may further include a planarization layer 104 disposed between the porous semiconductor layer 103 and the first semiconductor layer 111.

Figure 10:
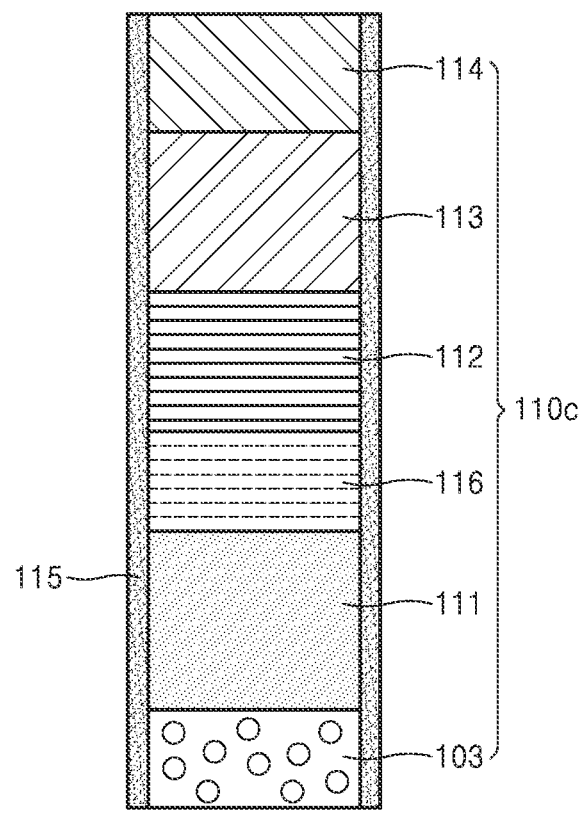
FIG. 10 is a cross-sectional view showing a schematic configuration of a nanorod light emitting device according to another example embodiment.

FIG. 10 is a cross-sectional view showing a schematic configuration of a nanorod light emitting device according to another example embodiment. In particular, FIG. 10 exemplarily shows the configuration of the nanorod light emitting device 500 formed by applying the process of patterning up to the upper surface of the porous semiconductor layer 103 to the substrate structure 1300 shown in FIG. 6. Referring to FIG. 10, the nanorod light emitting device 500 may include a semiconductor light emitting structure 110c and a passivation film 115. Compared to the semiconductor light emitting structure 110a illustrated in FIG. 8, the semiconductor light emitting structure 110c may further include a superlattice layer 116 disposed between the first semiconductor layer 111 and the light emitting layer 112. The semiconductor light emitting structure 110c may further include a planarization layer 104 disposed between the porous semiconductor layer 103 and the first semiconductor layer 111.

Figure 11A:
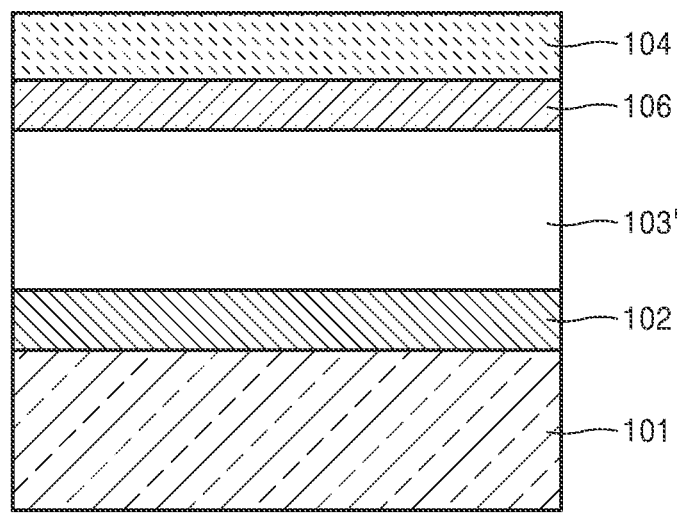
FIGS. 11A, 11B, and 11C are cross-sectional views illustrating an example of a method of manufacturing a plurality of nanorod light emitting devices and a substrate structure including the plurality of nanorod light emitting devices according to another example embodiment.
Figure 11B:
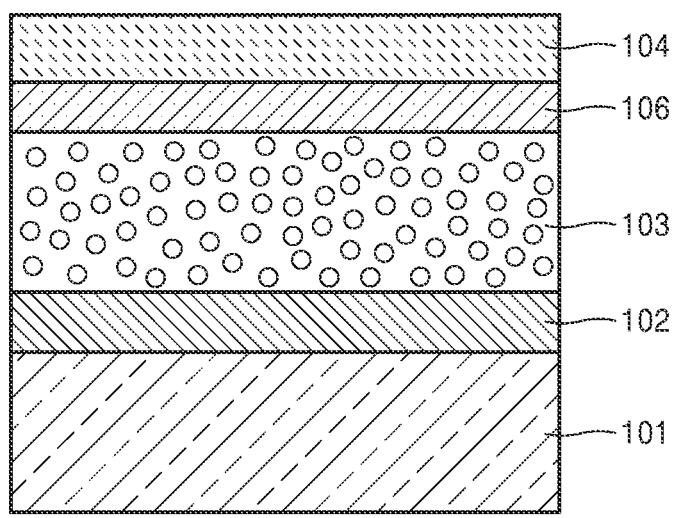
Figure 11C:
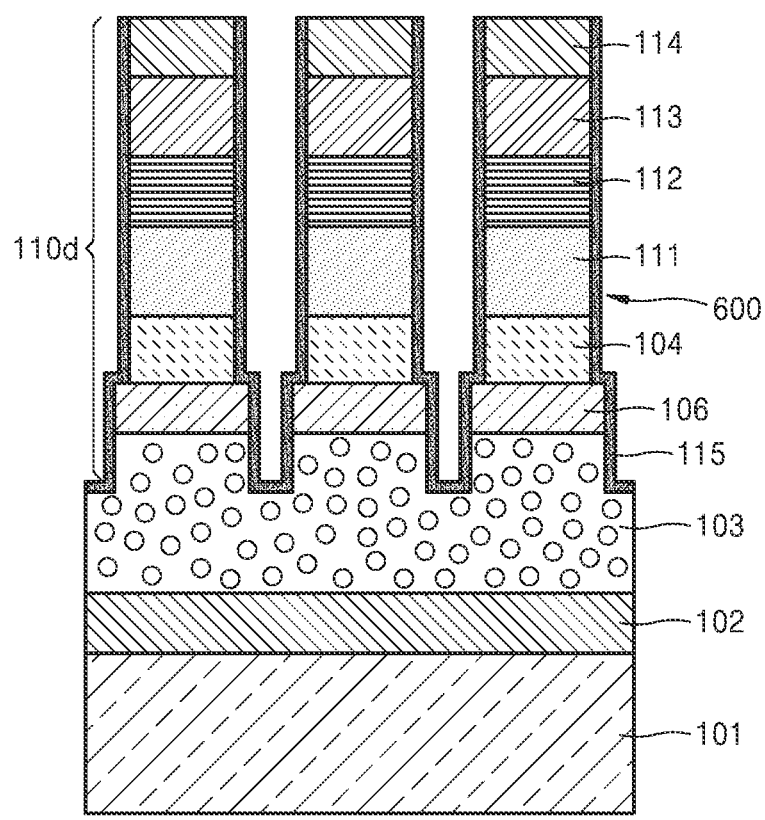

FIGS. 11A to 11C are cross-sectional views exemplarily illustrating a method of manufacturing a plurality of nanorod light emitting devices and a substrate structure including the plurality of nanorod light emitting devices according to another example embodiment.

Referring to FIG. 11A, an etch-resistant layer 106 may be further grown over the semiconductor material layer 103'. For example, a buffer layer 102, a semiconductor material layer 103', an etch-resistant layer 106, and a planarization layer 104 may be sequentially grown on the substrate 101. The semiconductor crystal layer 105 shown in FIG. 5A may be first grown on the buffer layer 102, and the semiconductor material layer 103', the etch-resistant layer 106, and the planarization layer 104 may be sequentially grown on the semiconductor crystal layer 105. In another example, the planarization layer 104 may be omitted. For example, only the buffer layer 102, the semiconductor material layer 103', and the etch-resistant layer 106 may be sequentially grown on the substrate 101. The etch-resistant layer 106 includes a semiconductor material having a slower etch rate than the first semiconductor layer 111, the light emitting layer 112, and the second semiconductor layer 113 formed over the etch-resistant layer 106 in the subsequent process. The etch-resistant layer 106 may be undoped.

Then, when electrochemical etching shown in FIG. 1B is performed, voids are formed only in the semiconductor material layer 103' having a high doping concentration. Accordingly, as shown in FIG. 11B, the porous semiconductor layer 103 may be formed between the buffer layer 102 and the etch-resistant layer 106.

Then, through the process described with reference to FIG. 1D, a first semiconductor layer 111, a light emitting layer 112, a second semiconductor layer 113, an electrode 114, and a patterned hard mask 150 are sequentially formed on the planarization layer 104 or directly on the etch-resistant layer 106. As described with reference to FIG. 7, after the first semiconductor layer 111 is completely etched until the porous semiconductor layer 103 is exposed, the etching may be stopped at the lower portion of the porous semiconductor layer 103. In this etching process, because the etching rate of the etch-resistant layer 106 is slower than that of the other layers formed thereon, the diameter of the etch-resistant layer 106 and the underlying porous semiconductor layer 103 may be larger than that of other layers. Then, when the passivation film 115 is formed in the manner shown in FIGS. 1G and 1H, the substrate structure 1500 shown in FIG. 11 may be provided.

Referring to FIG. 11C, the first semiconductor layers 111 of the plurality of nanorod light emitting devices 600 of the substrate structure 1500 are completely separated from each other. In addition, the upper portion of the porous semiconductor layer 103 between the plurality of nanorod light emitting devices 600 is partially etched. The lower portion of the porous semiconductor layer 103 may remain unetched and extend laterally along the upper surface of the buffer layer 102. Accordingly, the upper surface of the porous semiconductor layer 103 and the etch-resistant layer 106 may be patterned in the form of a plurality of vertical nanorods respectively extending downward of the plurality of semiconductor light emitting structures 110d, and the nanorod-shaped semiconductor light emitting structure 110d starts from the patterned upper portion of the porous semiconductor layer 103.

Compared to the substrate structure 1400 shown in FIG. 7, the semiconductor light emitting structure 110d of the substrate structure 1500 illustrated in FIG. 11C further includes an etch-resistant layer 106 disposed between the porous semiconductor layer 103 and the first semiconductor layer 111. Due to this etch-resistant layer 106, the diameters of the etch-resistant layer 106 and the porous semiconductor layer 103 disposed thereon in the semiconductor light emitting structure 110d may be larger than the diameters of other portions of the semiconductor light emitting structure 110d. For example, the diameters of the nanorod patterned portions of the etch-resistant layer 106 and the porous semiconductor layer 103 may be larger than the diameter of the planarization layer 104, the first semiconductor layer 111, the light emitting layer 112, the second semiconductor layer 113, and the electrode 114. Accordingly, damage to the lower portion of the nanorod light emitting device 600 may be reduced when the nanorod light emitting device 600 is removed from the substrate structure 1500.

Figure 12:
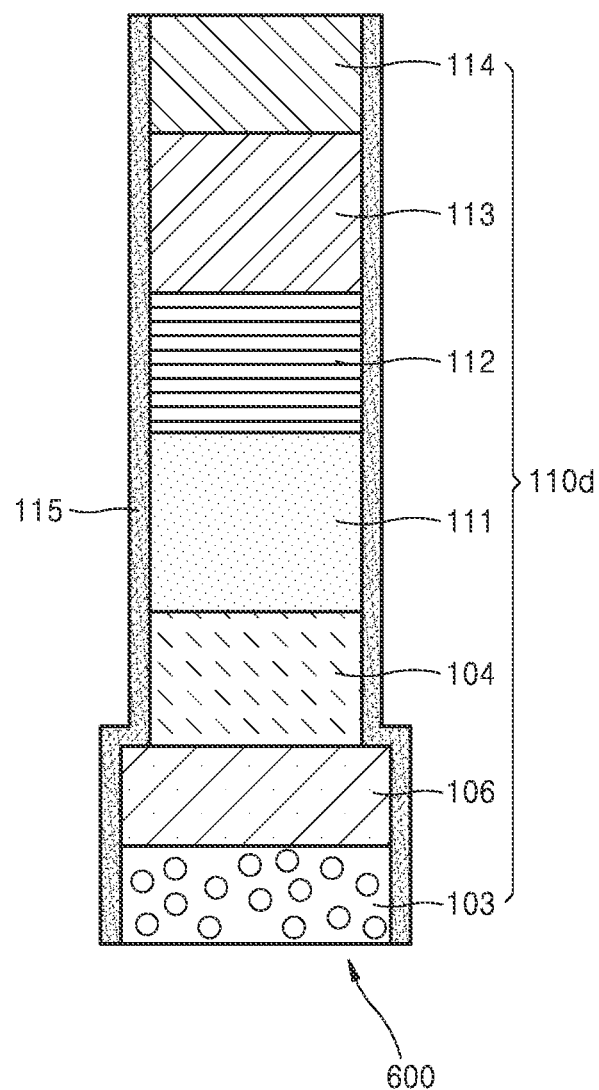
FIG. 12 is a cross-sectional view showing a schematic configuration of a nanorod light emitting device according to another example embodiment.

FIG. 12 is a cross-sectional view showing a schematic configuration of a nanorod light emitting device according to another example embodiment. In particular, FIG. 12 exemplarily shows the configuration of the nanorod light emitting device 600 separated from the substrate structure 1500 shown in FIG. 11C. Referring to FIG. 12, a nanorod light emitting device 600 may include a nanorod-shaped semiconductor light emitting structure 110d and a passivation film 115 surrounding a sidewall of the semiconductor light emitting structure 110d. The semiconductor light emitting structure 110d may include a porous semiconductor layer 103, an etch-resistant layer 106, a planarization layer 104, a first semiconductor layer 111, a light emitting layer 112, a second semiconductor layer 113, and an electrode 114. The diameters of the porous semiconductor layer 103 and the etch-resistant layer 106 may be larger than the diameters of the planarization layer 104, the first semiconductor layer 111, the light emitting layer 112, the second semiconductor layer 113, and the electrode 114. In another example, the planarization layer 104 may be omitted.

Figure 13A:
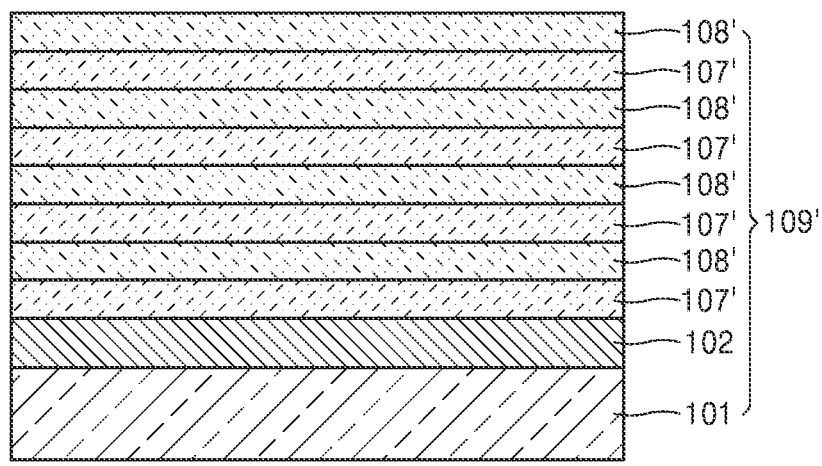
FIGS. 13A and 13B are schematic cross-sectional views illustrating a method of forming a porous semiconductor layer according to another example embodiment.
Figure 13B:
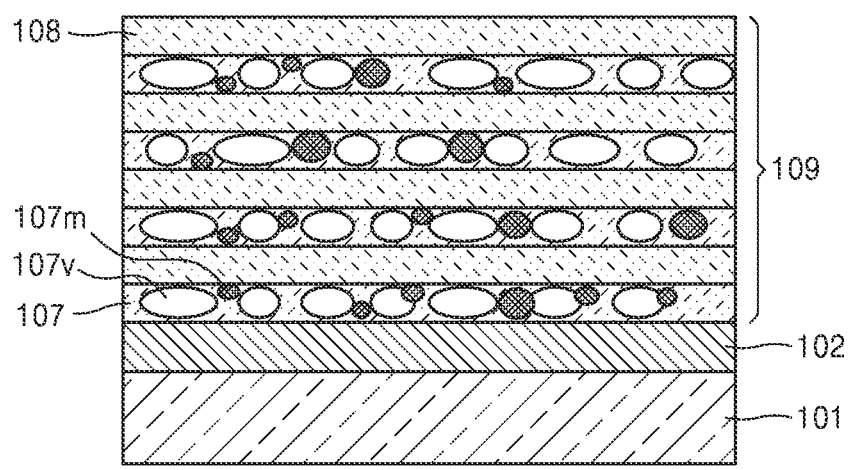

FIGS. 13A and 13B are schematic cross-sectional views illustrating a method of forming a porous semiconductor layer according to another example embodiment.

Referring to FIG. 13A, the buffer layer 102 is formed on the substrate 101, and a plurality of first semiconductor material layers 107' and a plurality of second semiconductor material layers 108' are alternately stacked on the buffer layer 102 one by one to form a semiconductor material layer 109'. Although FIG. 13A illustrates that the first semiconductor material layer 107' is first stacked on the buffer layer 102, embodiments are not limited thereto, and the second semiconductor material layer 108' may be stacked first. The first layer of semiconductor material 107' may include a semiconductor material including indium (In), and the second layer of semiconductor material 108' may include a semiconductor material that does not contain indium. For example, the first semiconductor material layer 107' may include indium gallium nitride (InGaN), and the second semiconductor material layer 108' may include AlGaN or GaN. The first semiconductor material layer 107' and the second semiconductor material layer 108' may be undoped.

Thereafter, annealing may be performed on the first semiconductor material layer 107' and the second semiconductor material layer 108' in the semiconductor material layer 109' disposed over the buffer layer 102. For example, the semiconductor material layer 109' may be annealed at a temperature between 800° C. and 900° C. in an atmosphere including hydrogen or nitrogen. Then, a plurality of voids may be formed in the first semiconductor material layer 107' while the indium metal in the first semiconductor material layer 107' including indium is precipitated.

Referring to FIG. 13B, a porous semiconductor layer 109 having a plurality of voids may be formed on the buffer layer 102 by the annealing process. The porous semiconductor layer 109 may include a plurality of first porous semiconductor layers 107 having a plurality of voids, and a plurality of second porous semiconductor layers 108 stacked alternately with the plurality of first porous semiconductor layers 107 without voids. The first porous semiconductor layer 107 may include a plurality of precipitated indium metal particles 107m and a plurality of voids 107v generated while the indium metal is precipitated. After the porous semiconductor layer 109 is formed, a nanorod light emitting device may be formed in the manner described above.

In the case of forming the porous semiconductor layer 103 by the electrochemical etching method shown in FIG. 1B, after forming the semiconductor material layer 103' over the buffer layer 102, the structure including the substrate 101 is pulled out of the chamber. Then, after the porous semiconductor layer 103 is formed, a structure including the substrate 101 is placed in the chamber again and a subsequent process is performed. However, in the case of forming the porous semiconductor layer 109 in the manner shown in FIGS. 13A and 13B, the process of forming the porous semiconductor layer 109 may be performed in a chamber. Accordingly, all processes of forming the nanorod light emitting device may be continuously performed in the chamber.

Figure 14:
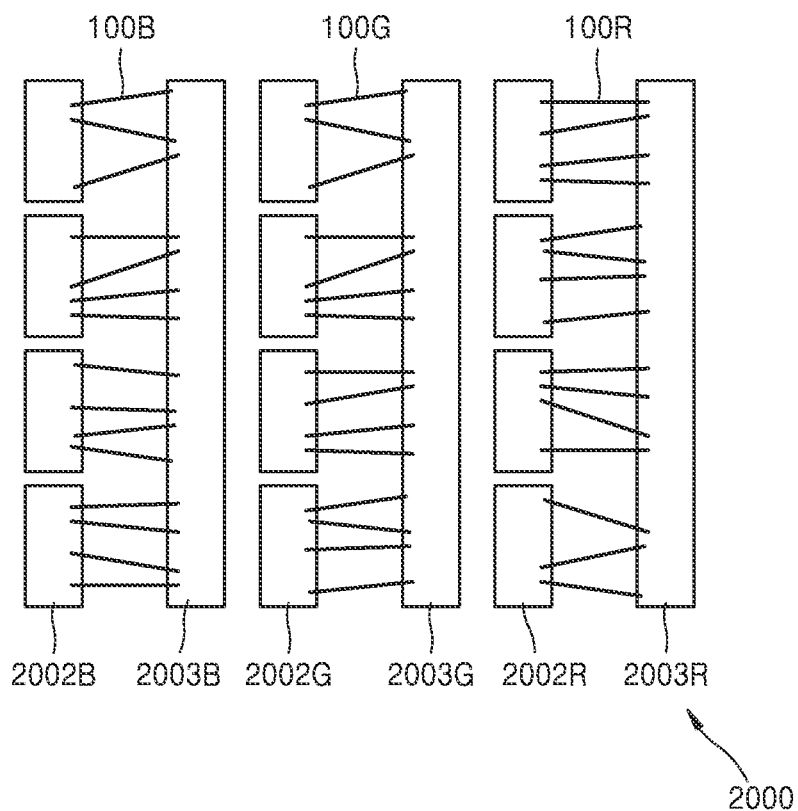
FIG. 14 is a conceptual diagram schematically showing a configuration of a display device according to an example embodiment including a nanorod light emitting device.

The nanorod light emitting device according to the above-described example embodiments may be applied in various ways. In particular, the nanorod light emitting device may be used as a light emitting element of pixels of a next-generation display device. For example, FIG. 14 is a conceptual diagram schematically showing a configuration of a display device according to an example embodiment using a nanorod light emitting device. Referring to FIG. 14, the display device 2000 may include a plurality of first pixel electrodes 2002B, a first common electrode 2003B corresponding to the plurality of first pixel electrodes 2002B, a plurality of second pixel electrodes 2002G, a second common electrode 2003G corresponding to the plurality of second pixel electrodes 2002G, a plurality of third pixel electrodes 2002R, a third common electrode 2003R corresponding to the plurality of third pixel electrodes 2002B, a plurality of first nanorod light emitting devices 100B connected between each of the first pixel electrodes 2002B and the first common electrode 2003B, a plurality of second nanorod light emitting devices 100G connected between each second pixel electrode 2002G and a second common electrode 2003G, and a plurality of third nanorod light emitting devices 100R connected between each third pixel electrode 2002R and the third common electrode 2003R.

For example, the first nanorod light emitting device 100B may be configured to emit blue light, the second nanorod light emitting device 100G may be configured to emit green light, and the third nanorod light emitting device 100R may be configured to emit red light. In addition, one first pixel electrode 2002B may constitute one blue sub-pixel together with the first common electrode 2003B, one second pixel electrode 2002G may constitute one green sub-pixel together with the second common electrode 2003G, and one third pixel electrode 2002R may constitute one red sub-pixel together with the third common electrode 2003R.

The nanorod light emitting devices 100, 200, 300, 400, and 500 according to the above-described example embodiments may be applied to display devices of various sizes and uses without limitation. For example, FIGS. 15 to 20 exemplarily show various devices including a display device to which nanorod light emitting devices according to an embodiment are applied.

Figure 15:
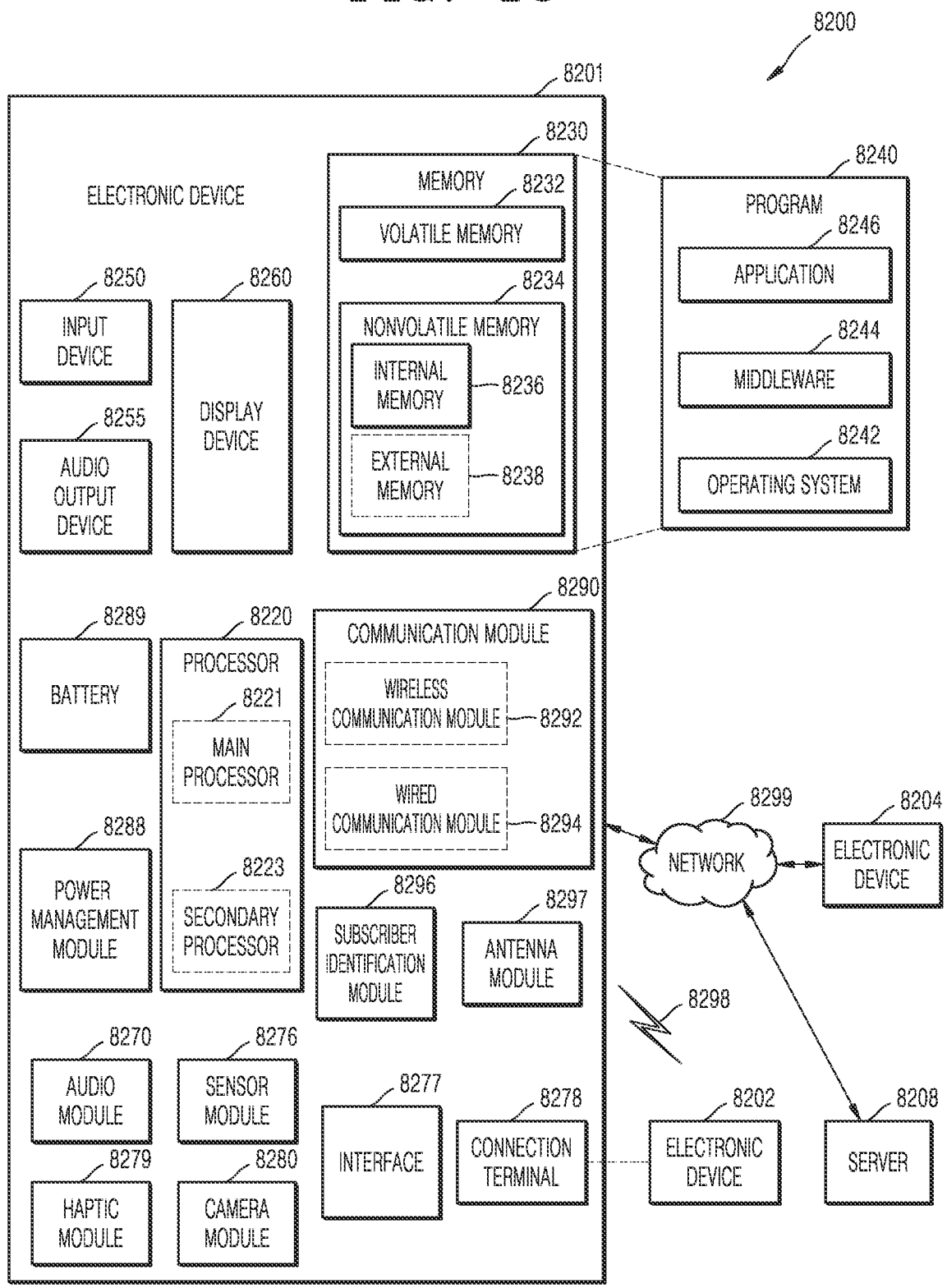
FIG. 15 is a schematic block diagram of an electronic device according to an example embodiment.

FIG. 15 is a schematic block diagram of an electronic device according to an example embodiment. Referring to FIG. 15, an electronic device 8201 may be provided in a network environment 8200. In the network environment 8200, the electronic device 8201 may communicate with another electronic device 8202 through a first network 8298 (such as a short-range wireless communication network, and the like), or communicate with another electronic device 8204 and/or a server 8208 through a second network 8299 (such as a remote wireless communication network). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, and an interface 8277, a haptic module 8279, a camera module 8280, a power management module 8288, a battery 8289, a communication module 8290, a subscriber identification module 8296, and/or an antenna module 8297. In the electronic device 8201, some of these components may be omitted or other components may be added. Some of these components may be implemented as one integrated circuit. For example, the sensor module 8276 (fingerprint sensor, iris sensor, illuminance sensor, etc.) may be implemented by being embedded in the display device 8260 (display, etc.).

The processor 8220 may execute software (the program 8240, etc.) to control one or a plurality of other components (such as hardware, software components, etc.) of the electronic device 8201 connected to the processor 8220, and perform various data processing or operations. As part of data processing or operation, the processor 8220 may load commands and/or data received from other components (the sensor module 8276, the communication module 8290, etc.) into the volatile memory 8232, process commands and/or data stored in the volatile memory 8232, and store result data in the nonvolatile memory 8234. The nonvolatile memory 8234 may include an internal memory 8236 mounted in the electronic device 8201 and a removable external memory 8238. The processor 8220 may include a main processor 8221 (such as a central processing unit, an application processor, etc.) and a secondary processor 8223 (such as a graphics processing unit, an image signal processor, a sensor hub processor, a communication processor, etc.) that may be operated independently or together. The secondary processor 8223 may use less power than the main processor 8221 and may perform specialized functions.

The secondary processor 8223 may control functions and/or states related to some of the components of the electronic device 8202 (such as the display device 8260, the sensor module 8276, the communication module 8290, etc.) instead of the main processor 8221 while the main processor 8221 is in an inactive state (sleep state), or with the main processor 8221 while the main processor 8221 is in an active state (application execution state). The secondary processor 8223 (such as an image signal processor, a communication processor, etc.) may be implemented as part of other functionally related components (such as the camera module 8280, the communication module 8290, etc.).

The memory 8230 may store various data required by components of the electronic device 8201 (such as the processor 8220, the sensor module 8276, etc.). The data may include, for example, software (such as the program 8240, etc.) and input data and/or output data for commands related thereto. The memory 8230 may include a volatile memory 8232 and/or a nonvolatile memory 8234.

The program 8240 may be stored as software in the memory 8230 and may include an operating system 8242, a middleware 8244, and/or an application 8246.

The input device 8250 may receive commands and/or data to be used for components (such as the processor 8220, etc.) of the electronic device 8201 from outside (a user) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as a part of the speaker or may be implemented as an independent separate device.

The display device 8260 may visually provide information to the outside of the electronic device 8201. The display device 8260 may include a display, a hologram device, or a projector and a control circuit for controlling the device. The display device 8260 may include the above-described driving circuit, micro semiconductor light emitting device, side reflection structure, bottom reflection structure, and the like. The display device 8260 may include a touch circuit set to sense a touch, and/or a sensor circuit (such as a pressure sensor) set to measure the strength of a force generated by the touch.

The audio module 8270 may convert sound into an electrical signal, or conversely, may convert an electrical signal into sound. The audio module 8270 may acquire sound through the input device 8250 or output sound through speakers and/or headphones of the audio output device 8255, and/or other electronic devices (such as the electronic device 8202) directly or wirelessly connected to electronic device 8201.

The sensor module 8276 may detect an operating state (such as power, temperature, and the like) of the electronic device 8201 or an external environmental state (such as a user state, and the like), and generate an electrical signal and/or data value corresponding to the detected state. The sensor module 8276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more specified protocols that may be used for the electronic device 8201 to connect directly or wirelessly with another electronic device (such as the electronic device 8202). The interface 8277 may include a high definition multimedia interface (HDMI), a universal serial bus (USB) interface, an SD card interface, and/or an audio interface.

The connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (such as vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject that is a target of image capturing.

The power management module 8288 may manage power supplied to the electronic device 8201. The power management module 8288 may be implemented as a part of a Power Management Integrated Circuit (PMIC).

The battery 8289 may supply power to components of the electronic device 8201. The battery 8289 may include a non-rechargeable primary cell, a rechargeable secondary cell, and/or a fuel cell.

The communication module 8290 may support establishing a direct (wired) communication channel and/or a wireless communication channel, and performing communication through the established communication channel between the electronic device 8201 and other electronic devices (such as the electronic device 8102, the electronic device 8204, the server 8208, and the like). The communication module 8290 may include one or more communication processors that operate independently of the processor 8220 (such as an application processor) and support direct communication and/or wireless communication. The communication module 8290 may include a wireless communication module 8292 (such as a cellular communication module, a short-range wireless communication module, a Global Navigation Satellite System (GNSS) communication module, and the like) and/or a wired communication module 8294 (such as a local area network (LAN) communication module, a power line communication module, and the like). Among these communication modules, a corresponding communication module may communicate with other electronic devices through a first network 8298 (a short-range communication network such as Bluetooth, WiFi Direct, or Infrared Data Association (IrDA)) or a second network 8299 (a cellular network, the Internet, or a telecommunication network such as a computer network (such as LAN, WAN, and the like)). These various types of communication modules may be integrated into one component (such as a single chip, and the like), or may be implemented as a plurality of separate components (a plurality of chips). The wireless communication module 8292 may check and authenticate the electronic device 8201 in a communication network such as the first network 8298 and/or the second network 8299 using the subscriber information (such as international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator made of a conductive pattern formed on a substrate (such as PCB, etc.). The antenna module 8297 may include one or a plurality of antennas. If multiple antennas are included, an antenna suitable for a communication method used in a communication network such as the first network 8290 and/or the second network 8298 may be selected from the plurality of antennas by the communication module 8299. Signals and/or power may be transmitted or received between the communication module 8290 and another electronic device through the selected antenna. In addition to the antenna, other components (such as RFIC) may be included as part of the antenna module 8297.

Some of the components are connected to each other and may exchange signals (such as commands, data, and the like) through communication method between peripheral devices (such as bus, General Purpose Input and Output (GPIO), Serial Peripheral Interface (SPI), Mobile Industry Processor Interface (MIPI), and the like).

The command or data may be transmitted or received between the electronic device 8201 and the external electronic device 8204 through the server 8208 connected to the second network 8299. The other electronic devices 8202 and 8204 may be the same or different types of devices as or from the electronic device 8201. All or some of the operations executed by the electronic device 8201 may be executed by one or more of the other electronic devices 8202, 8204, and 8208. For example, when the electronic device 8201 needs to perform a certain function or service, instead of executing the function or service itself, the electronic device 2201 may request one or more other electronic devices to perform the function or part or all of the service. One or more other electronic devices that receive the request may execute an additional function or service related to the request, and transmit a result of the execution to the electronic device 8201. For this, cloud computing, distributed computing, and/or client-server computing technology may be used.

Figure 16:
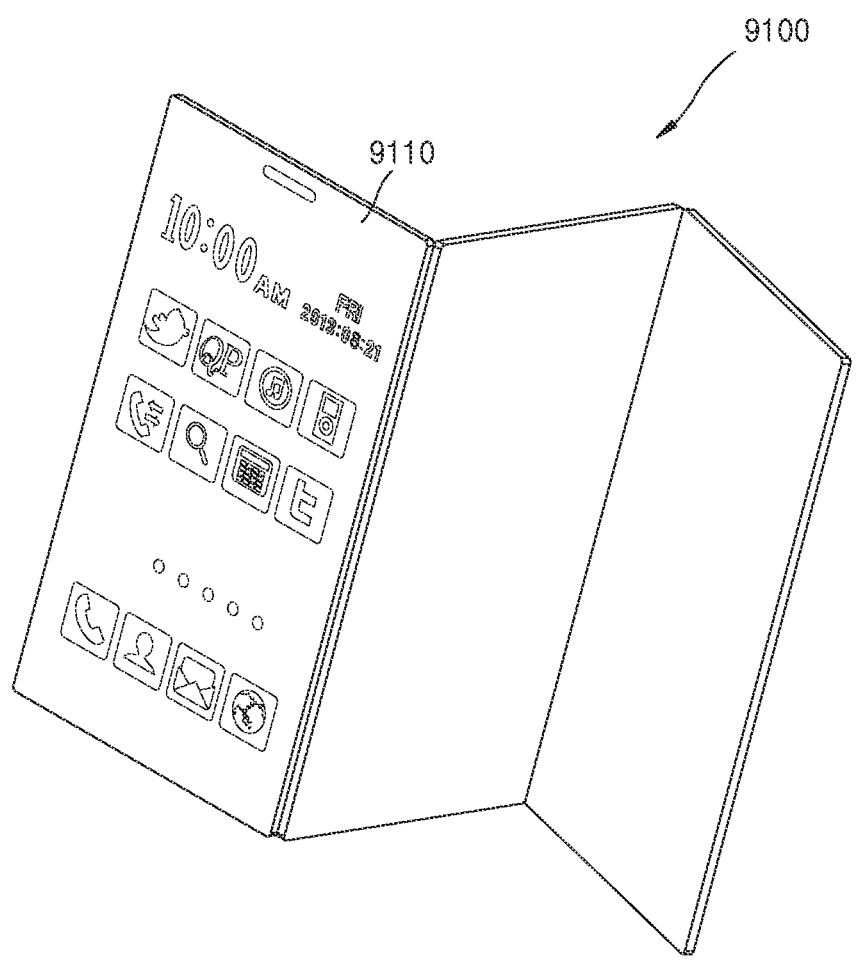
FIG. 16 illustrates an example of applying a display device according to example embodiments to a mobile device.

FIG. 16 illustrates an example in which a display device according to example embodiments is applied to a mobile device. The mobile device 9100 may include a display device 9110, and the display device 9110 may include the above-described driving circuit, micro semiconductor light emitting device, side reflection structure, bottom reflection structure, and the like. The display device 9110 may have a foldable structure, for example, a multi-foldable structure.

Figure 17:
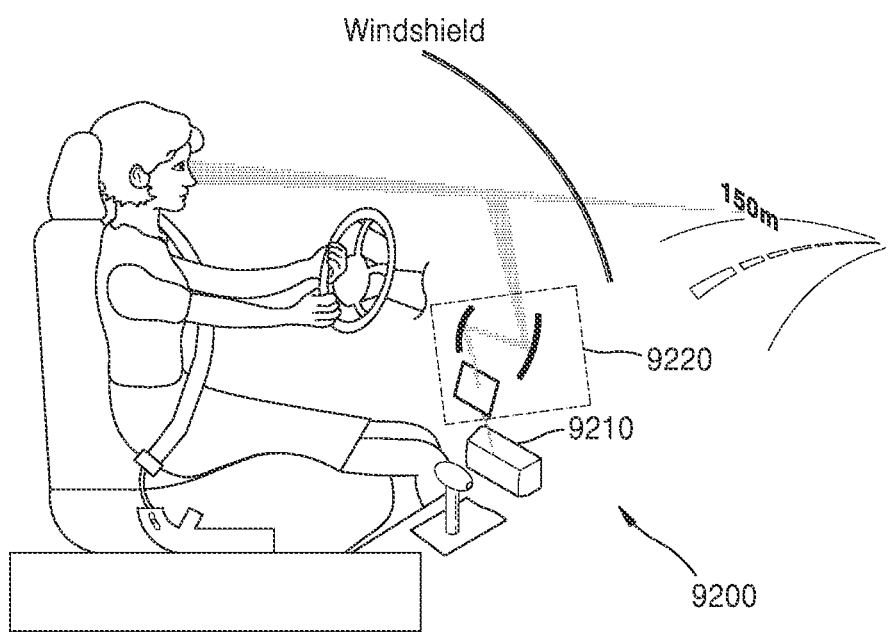
FIG. 17 illustrates an example of applying the display device according to the example embodiments to a vehicle display device.

FIG. 17 illustrates an example in which the display device according to the example embodiments is applied to a vehicle display device. The display device may be a vehicle head-up display device 9200, and may include a display 9210 provided in an area of the vehicle, and a light path changing member 9220 that converts an optical path so that the driver may see the image generated on the display 9210.

Figure 18:
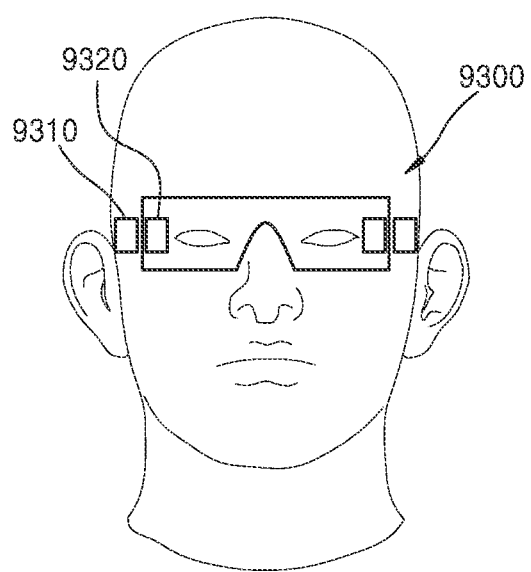
FIG. 18 illustrates an example of applying a display device according to example embodiments to augmented reality glasses or virtual reality glasses.

FIG. 18 illustrates an example in which a display device according to example embodiments is applied to augmented reality glasses or virtual reality glasses. The augmented reality glasses 9300 may include a projection system 9310 that forms an image, and an element 9320 that guides the image from the projection system 9310 into the user's eye. The projection system 9310 may include the above-described driving circuit, micro semiconductor light emitting device, side reflection structure, bottom reflection structure, and the like.

Figure 19:
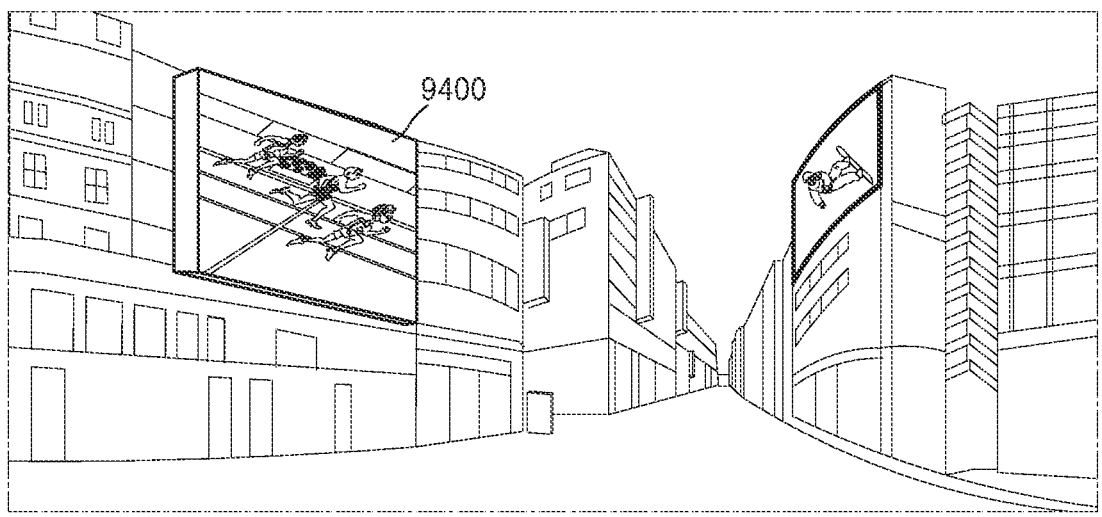
FIG. 19 illustrates an example of applying a display device according to example embodiments to a signage.

FIG. 19 illustrates an example in which a display device according to example embodiments is applied to a signage. A signage 9400 may be used for outdoor advertisement using a digital information display, and may control advertisement contents and the like through a communication network. The signage 9400 may be implemented, for example, through the electronic device described with reference to FIG. 15.

Figure 20:
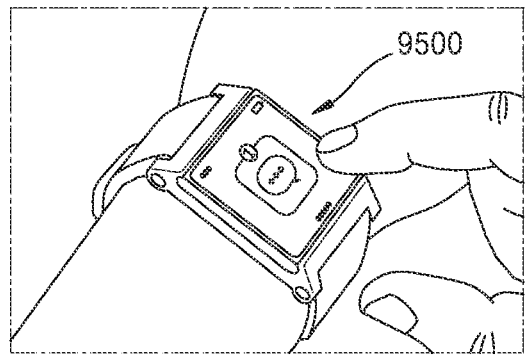
FIG. 20 illustrates an example of applying a display device according to example embodiments to a wearable display.

FIG. 20 illustrates an example in which a display device according to example embodiments is applied to a wearable display. The wearable display 9500 may include the above-described driving circuit, micro semiconductor light emitting device, side reflection structure, bottom reflection structure, and the like, and may be implemented through the electronic device described with reference to FIG. 15.

The display device according to the example embodiment may also be applied to various products such as a rollable TV and a stretchable display.

Although the above-described nanorod light emitting device, substrate structure including a plurality of nanorod light emitting devices, and method of manufacturing the substrate structure have been described with reference to the example embodiment shown in the drawings, this is only exemplary, and those of ordinary skill in the art will understand that various modifications and equivalent other embodiments are possible therefrom. Therefore, the example embodiments should be considered from an illustrative point of view rather than a limiting point of view. The scope of the rights is indicated in the claims rather than the above description, and all differences within the scope of the same should be interpreted as being included in the scope of the rights.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A substrate structure comprising:
   a substrate;
   a buffer layer disposed on the substrate;
   a porous semiconductor layer disposed on the buffer layer, the porous semiconductor layer having a plurality of voids;
   a plurality of semiconductor light emitting structures disposed on the porous semiconductor layer, the plurality of semiconductor light emitting structures having a nanorod shape and extending vertically;
   a planarization layer disposed between the porous semiconductor layer and the plurality of semiconductor light emitting structures; and
   a passivation film disposed on entire sidewalls of each of the plurality of semiconductor light emitting structures, the passivation film having an insulation property,
   wherein lower portions of the plurality of semiconductor light emitting structures extend horizontally along an upper surface of the planarization layer such that lower portions of the plurality of semiconductor light emitting structures are connected to each other.

2. The substrate structure of claim 1, wherein each of the plurality of semiconductor light emitting structures comprises:
   a first semiconductor layer disposed on the porous semiconductor layer and doped with an impurity of a first conductivity type;
   a light emitting layer disposed on the first semiconductor layer and having a multi-quantum well structure;
   a second semiconductor layer disposed on the light emitting layer and doped with an impurity of a second conductivity type that is electrically opposite to the first conductivity type; and
   an electrode disposed on the second semiconductor layer.

3. The substrate structure of claim 2, wherein the porous semiconductor layer is doped with the impurity of the first conductivity type.

4. The substrate structure of claim 2, wherein a lower portion of the first semiconductor layer extends horizontally along an upper surface of the planarization layer such that lower portions of the first semiconductor layer of the plurality of semiconductor light emitting structures are connected to each other, and
   wherein the passivation film extends over an upper surface of the first semiconductor layer between the plurality of semiconductor light emitting structures.

5. The substrate structure of claim 2, wherein each of the plurality of semiconductor light emitting structures further comprises a superlattice layer disposed between the first semiconductor layer and the light emitting layer, and
   wherein the superlattice layer comprises:
   a plurality of first layers including a same material as a material of the first semiconductor layer; and
   a plurality of second layers including a same material as a material of the light emitting layer, the plurality of second layer being alternately stacked with the plurality of first layers.

6. The substrate structure of claim 1, wherein each of the plurality of semiconductor light emitting structures has a height ranging from 1 μm to 20 μm, and a diameter ranging from 0.05 μm to 1 μm.

7. The substrate structure of claim 1, wherein the porous semiconductor layer and the planarization layer include a same semiconductor material, and
   wherein the porous semiconductor layer is doped with an impurity of a first conductivity type, and the planarization layer is not doped or doped with the impurity of the first conductivity type with a doping concentration lower than a doping concentration of the porous semiconductor layer.

8. The substrate structure of claim 7, wherein the doping concentration of the porous semiconductor layer ranges from $10^{18}$ cm$^{-3}$ to $10^{20}$ cm$^{-3}$, and the doping concentration of the planarization layer ranges from 0 cm$^{-3}$ to $10^{16}$ cm$^{-3}$.

9. The substrate structure of claim 1, further comprising a semiconductor crystal layer disposed between the buffer layer and the porous semiconductor layer,
   wherein the porous semiconductor layer and the semiconductor crystal layer include a same semiconductor material, and
   wherein the porous semiconductor layer is doped with an impurity of a first conductivity type, and the semiconductor crystal layer is undoped.

10. The substrate structure of claim 1, wherein the porous semiconductor layer comprises a plurality of first porous semiconductor layers having a plurality of voids and a plurality of second porous semiconductor layers without voids, and
    wherein the plurality of second porous semiconductor layers are alternately stacked with the plurality of first porous semiconductor layers.

* * * * *